US 12,476,189 B2

(12) United States Patent
Huang et al.

(10) Patent No.: US 12,476,189 B2
(45) Date of Patent: Nov. 18, 2025

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Sheng-Feng Huang, Taoyuan (TW); Jiann-Tyng Tzeng, Hsinchu (TW); Shih-Wei Peng, Hsinchu (TW); Yu-Rong Chen, Yilan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 406 days.

(21) Appl. No.: 18/299,043

(22) Filed: Apr. 11, 2023

(65) Prior Publication Data
US 2024/0347458 A1 Oct. 17, 2024

(51) Int. Cl.
*H01L 23/528* (2006.01)
*H01L 23/48* (2006.01)
*H01L 23/522* (2006.01)

(52) U.S. Cl.
CPC ........ *H01L 23/5286* (2013.01); *H01L 23/481* (2013.01); *H01L 23/5226* (2013.01)

(58) Field of Classification Search
CPC .......................... H01L 23/5286; H01L 23/481; H01L 23/5226
USPC ........................................................ 257/734
See application file for complete search history.

(56) References Cited

U.S. PATENT DOCUMENTS 9,806,019 B2 * 10/2017 Jarrar ..................... H10D 88/00

OTHER PUBLICATIONS

Multi-Vth Level Conversion Circuits for Multi-VDD Systems; Sherif A. Tawfik; Volkan Kursun; Department of Electrical and Computer Engineering, University of Wisconsin-Madison, Madison, Wisconsin , 2007.

* cited by examiner

*Primary Examiner* — Tu-Tu V Ho
(74) *Attorney, Agent, or Firm* — WPAT LAW; Anthony King

(57) ABSTRACT

A semiconductor device and a method for manufacturing the semiconductor device are provided. The semiconductor device comprises a first electrical conductor, a second electrical conductor, a third electrical conductor, a plurality of metal features and a plurality of active regions. The first electrical conductor extends along a first direction and is electrically coupled to a first voltage. The second electrical conductor extends along the first direction and is electrically coupled to a second voltage. The second voltage is lower than the first voltage. The third electrical conductor extending along the first direction is electrically coupled to a third voltage and disposed between the first electrical conductor and the second electrical conductor. The metal features extend along a second direction perpendicular to the first direction and are formed above the first electrical conductor, the second electrical conductor and the third electrical conductor.

20 Claims, 16 Drawing Sheets

SEMICONDUCTOR DEVICE AND METHOD OF MANUFACTURING THE SAME

BACKGROUND

The present disclosure relates, in general, to semiconductor devices and methods for manufacturing the same. Specifically, the present disclosure relates to semiconductor devices and methods for manufacturing semiconductor products with a hybrid power domain.

Semiconductor devices with cells of different voltages have been widely used for various applications. Cells of a high voltage enable high performance computing, while those of a low voltage can reduce power consumption. However, such semiconductor devices may increase routing costs and deteriorate the power consumption.

BRIEF DESCRIPTION OF THE DRAWINGS

Aspects of the embodiments of the present disclosure are best understood from the following detailed description when read with the accompanying figures. It should be noted that, in accordance with standard practice in the industry, various structures are not drawn to scale. In fact, the dimensions of the various structures can be arbitrarily increased or reduced for clarity of discussion.

DETAILED DESCRIPTION

Figure 1:
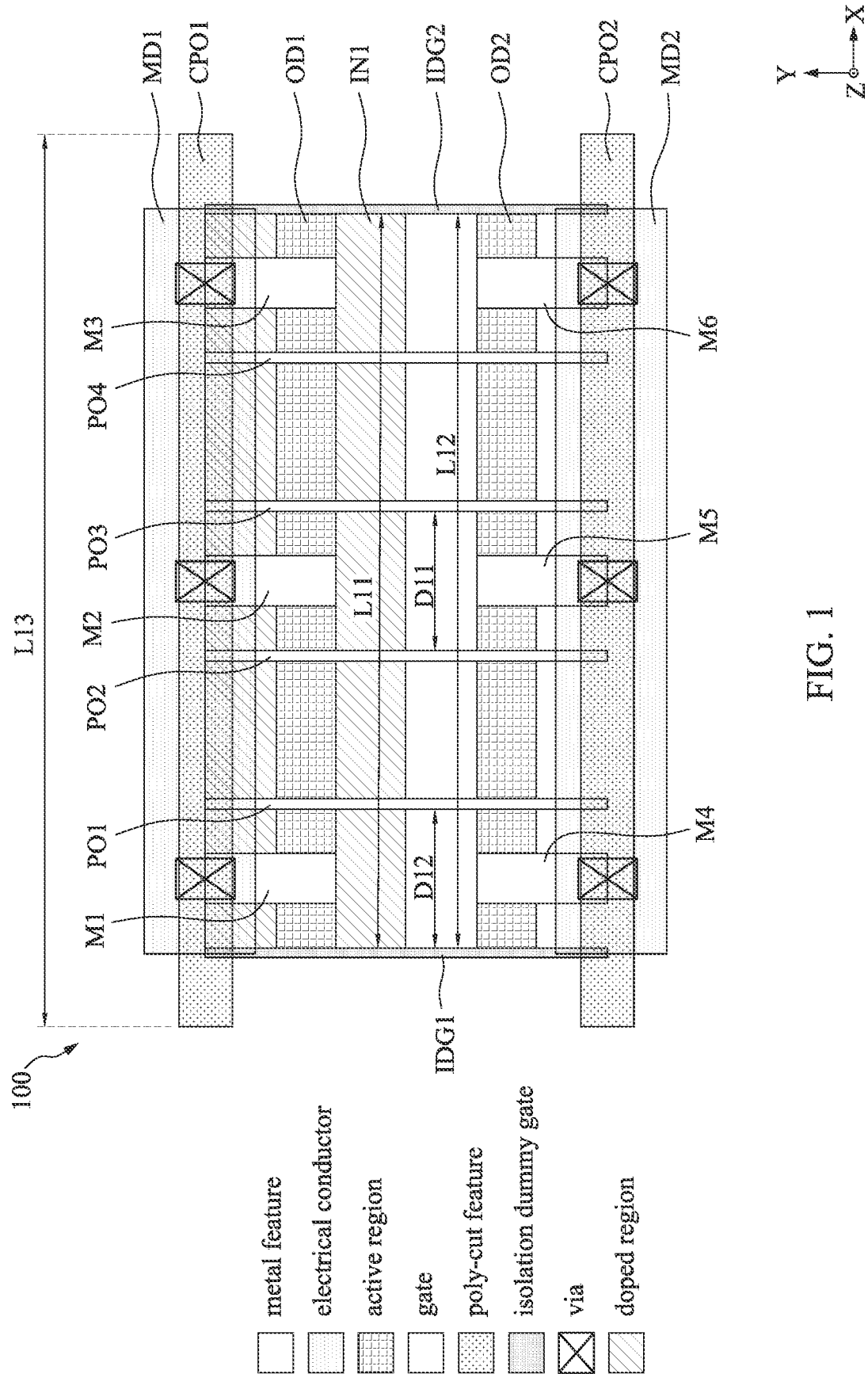
FIG. 1 is a schematic view of a layout of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In some embodiments, cells in a layout diagram (or, alternatively, counterpart cell regions in a corresponding semiconductor device) are isolated from each other by an isolation dummy gate. In some embodiments, an isolation dummy gate which separates first and second portions of an active region within a first cell of a layout diagram (or, alternatively, counterpart first and second cell regions) is referred to as an internal isolation dummy gate whereas each one or more isolation dummy gates which isolate the first cell (alternatively, the counterpart first cell region) from a second cell of the layout diagram (alternatively, a counterpart second cell region in the corresponding semiconductor device) is referred to as an external isolation dummy gate. The isolation dummy gate cuts an active region, causing the aforesaid active region to be discontinuous. The length of an active region affects the mobility of carriers (e.g., hole or electron), resultantly affecting the performance of a semiconductor device. For example, P-type field-effect transistor (FET) tends to have a relatively long active region. Various embodiments of the present disclosure provide layout diagrams (and corresponding semiconductor devices based thereon) that selectively adjust the length of the active regions in either P-type FET and/or N-type FET active regions to improve the performance of the semiconductor device.

FIG. 1 is a schematic view of a layout of a semiconductor device 100, in accordance with some embodiments of the present disclosure. In some embodiments, the semiconductor device 100 is applicable to, for example, a planar FET, a Fin Field-Effect Transistor (FinFET), a nanosheet FET, or other suitable FETs.

For simplicity of disclosure, semiconductor device 100 is represented by a layout diagram. The layout diagram of FIG. 1 is representative of semiconductor device 100; as a practical matter, semiconductor device 100 is fabricated according to the layout diagram of FIG. 1. In terms of nomenclature, elements in semiconductor device 100 are represented by patterns (also known as shapes) in the layout diagram of FIG. 1. For simplicity of discussion, most elements in the layout diagram of FIG. 1 (and in other layout diagrams disclosed herein) are referred to as counterpart structures rather than patterns/shapes per se. For example, element PO1 in FIG. 1 is a pattern that represents a gate of a transistor in semiconductor device 100 but is referred to as counterpart gate PO1 rather than as gate pattern PO1. Nevertheless, not all of the elements of semiconductor device 100 are explicitly discussed herein in terms of semiconductor-device-phraseology. For example, cell region in semiconductor device 100 is referred to as cell, the abbreviation (cell instead of cell region) reflecting the use of layout-diagram phraseology for element. Regarding other layout diagrams disclosed herein which are used to represent corresponding semiconductor devices, a nomenclature similar to FIG. 1 is followed.

In some embodiments, the semiconductor device 100 includes active regions OD1 and OD2, gates PO1, PO2, PO3 and PO4, electrical conductors MD1 and MD2, isolation dummy gates IDG1 and IDG2, metal features M1, M2, M3, M4, M5 and M6, poly-cut features CPO1 and CPO2, and a doped region IN1. It should be noted that the terms "comprise" or "comprising," "include" or "including," "have" or "having," and the like used in this application are to be understood to be open-ended, i.e., to mean: including, but not limited to. Accordingly, various elements and/or structures, which are not shown in FIG. 1 and formed in the semiconductor device 100, are within the contemplated scope of the present disclosure.

In some embodiments, each of the isolation dummy gates IDG1 and IDG2 is disposed on an edge of the semiconductor device 100 to electrically isolate the semiconductor device 100 from other semiconductor devices. An isolation dummy gate is a dielectric structure that includes one or more dielectric materials and functions as an electrical isolation structure. Accordingly, an isolation dummy gate is not a structure that is electrically conductive and thus does not function, e.g., as an active gate of a transistor. An isolation dummy gate includes one or more dielectric materials and functions as an electrical isolation structure. In some embodiments, an isolation dummy gate is based on a gate structure as a precursor. In some embodiments, a dummy gate structure includes a gate conductor, a gate-insulator layer, (optionally) one or more spacers, or the like. In some embodiments, an isolation dummy gate is formed by first forming a gate structure, e.g., a dummy gate structure, sacrificing/removing (e.g., etching) the gate conductor of the gate structure to form a trench, (optionally) removing a portion of a substrate that previously had been under the gate conductor to deepen the trench, and then filling the trench with one or more dielectric materials such that the physical dimensions of the resultant electrical isolation structure, i.e., the isolation dummy gate, are similar to the dimensions of the dummy gate conductor which was sacrificed, namely the gate conductor or the combination of the gate conductor and the portion of the substrate. In some embodiments, each of the isolation dummy gates IDG1 and IDG2 is a dielectric feature that includes one or more dielectric materials (e.g., oxide, nitride, oxynitride, or other suitable materials), and functions as an isolation feature. The isolation dummy gates IDG1 and IDG2 extend along a Y-axis. In some embodiments, each of the isolation dummy gates IDG1 and IDG2 is a continuous polysilicon on oxide diffusion (OD) edge structure, and is referred to as a CPODE structure.

The gates PO1 to PO4 extend along the Y-axis. The gates PO1 to PO4 are spaced apart from each other by a distance D11. The gates PO1 to PO4 are disposed between the isolation dummy gates IDG1 and IDG2. In some embodiments, each of the gates PO1 to PO4 extends across the active regions OD1 and OD2. In some embodiments, a distance D12 can be arranged between the gate and isolation dummy gate, such as between the gate PO1 and the isolation dummy gate IDG1. The distance D11 can be substantially identical to the distance D12. The distance D11 can be different from the distance D12. The distance D11 can be smaller than the distance D12. The distance D11 can be greater than or exceed the distance D12.

Each of the gates PO1 to PO4 includes a gate dielectric layer (not shown) and a gate electrode layer (not shown) disposed on the gate dielectric layer. The gate dielectric layer includes silicon oxide (SiOx), silicon nitride (SixNy), silicon oxynitride (SiON), or a combination thereof. The gate dielectric layer includes dielectric material(s), such as high-k dielectric material. The high-k dielectric material has a dielectric constant (k value) greater than 4. The high-k material includes hafnium oxide (HfO2), zirconium oxide (ZrO2), lanthanum oxide (La2O3), yttrium oxide (Y2O3), aluminum oxide (Al2O3), titanium oxide (TiO2) or another applicable material. Other suitable materials are within the contemplated scope of the disclosure.

The gate electrode layer is made of conductive material, such as aluminum (Al), copper (Cu), tungsten (W), titanium (Ti), tantalum (Ta), or other applicable materials. In some embodiments, the gate electrode layer includes a work function layer. The work function layer is made of metal material, and the metal material includes N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure.

The electrical conductors MD1 and MD2 extend along the X-axis. The electrical conductors MD1 and MD2 are spaced apart from each other. The electrical conductor MD1 extends across portions of the metal features M1 to M3 along the X-axis, while the electrical conductor MD2 extends across portions of the metal features M4 to M6 along the X-axis. In some embodiments, each of the electrical conductors MD1 and MD2 is a continuous metal region. In some embodiments, the electrical conductor MD1 extends continuously between the isolation dummy gates IDG1 and IDG2 along the X-axis. In some embodiments, the electrical conductor MD2 extends continuously between the isolation dummy gates IDG1 and IDG2 along the X-axis.

The metal features M1 to M6 extend along the Y-axis perpendicular to the X-axis. Each of the metal features M1 to M6 is configured to electrically connect a source/drain feature to an active region. The metal features M1 to M6 are disposed between the isolation dummy gates IDG1 and IDG2. The metal features M1 to M6 are spaced apart from each other. The metal features M1 and M4 are disposed between the isolation dummy gate IDG1 and the gate PO1. The metal features M2 and M5 are disposed between the gates PO2 and PO3. The metal features M3 and M6 are disposed between the isolation dummy gate IDG2 and the gate PO4. The metal features M1 to M6 can be formed in two rows. The metal features M1 to M3 can be electrically coupled to the electrical conductor MD1 through vias. The metal features M4 to M6 can be electrically coupled to the electrical conductor MD2 through vias.

The active regions OD1 and OD2 extend along the X-axis. In some embodiments, each of the active regions OD1 and OD2 is a region with a semiconductor surface wherein various doped features are formed and configured to one or more device, such as a diode, a transistor, and/or other suitable devices. The active regions OD1 and OD2 are spaced apart from each other. The active region OD1 extends across the metal features M1 to M3 along the X-axis, while the active region OD2 extends across the metal features M4 to M6 along the X-axis. In some embodiments, each of the active regions OD1 and OD2 is a continuous active region. In some embodiments, the active region OD1 extends continuously between the isolation dummy gates IDG1 and IDG2 along the X-axis. In some embodiments, the active region OD1 terminates at the right side of the isolation dummy gate IDG1 and at the left side of the isolation dummy gate IDG2 and has a length L11. In some embodiments, the active region OD2 extends continuously between the isolation dummy gates IDG1 and IDG2 along the X-axis. In some embodiments, the active region OD2 terminates at the right side of the isolation dummy gate IDG1 and at the left side of the isolation dummy gate IDG2 and has a length L12. In some embodiments, L11 is substantially equal to L12. The lengths L11 and L12 can be substantially equal to the length L13 of the poly-cut feature CPO1. The lengths L11 and L12 can be different from the length L13 of the poly-cut feature CPO1. The lengths L11 and L12 can be smaller than the length L13 of the poly-cut feature CPO1. In some embodiments, the term "active region" discussed in the present disclosure may also be referred to as an oxide dimensioned area.

The doped region IN1 extends along the X-axis. The doped region IN1 terminates at the right side of the isolation dummy gate IDG1 and at the left side of the isolation dummy gate IDG2. The active region OD1 can be formed within the doped region IN1 from the perspective view of Z-axis. The area of the doped region IN1 can exceed the area of the active region OD1. The area of the doped region IN1 can exceed the area of the electrical conductor MD1 and overlaps at least a portion of the electrical conductor MD1. The doped region IN1 can overlap the active region OD1 and the metal features MD1 to MD3. The active region OD2 and the metal features MD4 to MD6 can be free from overlapping the doped region IN1. The doped region IN1 can have a P-type or an N-type dopant. The doped region IN1 can include p-type dopants, such as boron, BF2+, and/or a combination thereof. The doped region IN1 can include n-type dopants, such as phosphorus, arsenic, and/or a combination thereof. The terms "overlap" and "overlapping" in this disclosure are used to describe two elements and/or features being at least partially vertically, or along a Z-axis, aligned with each other.

Figure 2A:
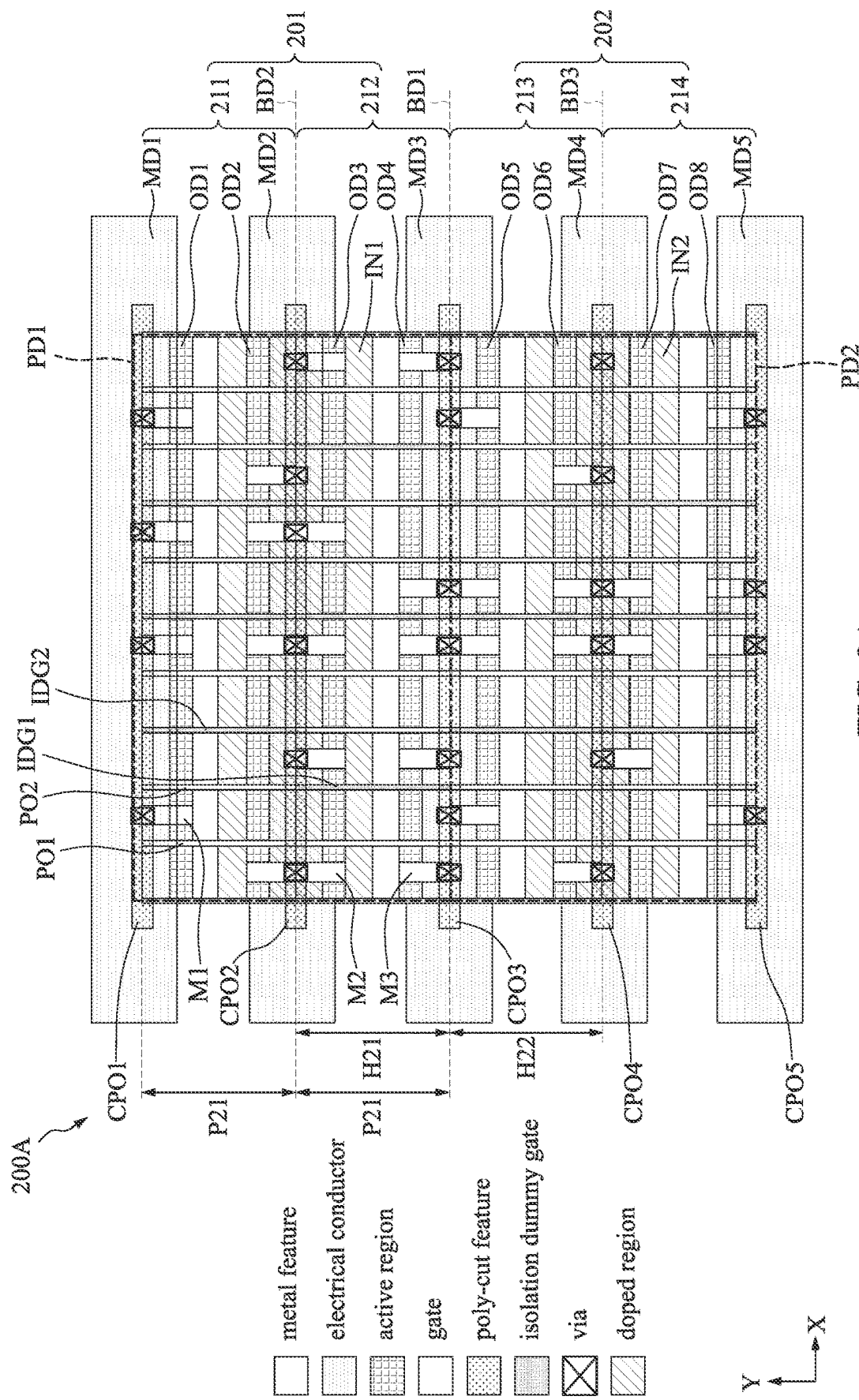
FIG. 2A is a schematic view of a layout of a semiconductor device, in accordance with some embodiments of the present disclosure.

FIG. 2A is a schematic view of a layout of a semiconductor device 200A, in accordance with some embodiments of the present disclosure. The semiconductor device 200 can be similar to the semiconductor device 100, except that the semiconductor device 200 includes more cells, gates, electrical conductors, poly-cut features, doped regions and active regions.

In some embodiments, the semiconductor device 200A includes at least one cell. As shown in FIG. 2A, the semiconductor device 200A can include four cells 211, 212, 213 and 214. Each of the cells 211, 212, 213 and 214 can be a predesigned IC structure to be repeatedly used in individual IC designs. Effective IC design layouts include various predesigned cell and predefined rules of placing the cell for enhanced circuit performance and reduced circuit areas. The cells 211 to 214 can be repeatedly used in integrated circuit designs and therefore predesigned according to manufacturing technologies and saved in a standard cell library. IC designers retrieve the cell from the standard cell library, incorporate it into their IC designs, and place it into the IC layout according to the predefined placing rules. Each of the cells 211, 212, 213 and 214 includes various basic circuit devices, such as an inverter, AND, NAND, OR, XOR, and NOR, which are popular in digital circuit designs for applications, such as central processing unit (CPU), graphic processing unit (GPU), and system on chip (SOC) chip designs. Each of the cells 211, 212, 213 and 214 includes other frequently used circuit blocks, such flip-flop circuit and latch.

The cells 211 to 214 can be separated by boundaries BD1, BD2 and BD3. The boundaries BD1, BD2 and BD3 can be parallel. As shown in FIG. 2A, the boundary BD2 can be provided between the cells 211 and 212. The boundary BD1 can be provided between the cells 212 and 213. The boundary BD3 can be provided between the cells 213 and 214. The boundaries BD1 can overlap the electrical conductor MD3 or the poly-cut feature CPO3. The boundaries BD1 can be collinear with the electrical conductor MD3 or the poly-cut feature CPO3. The boundaries BD1 can align with the electrical conductor MD3 or the poly-cut feature CPO3. The boundaries BD2 can overlap the electrical conductor MD2 or the poly-cut feature CPO2. The boundaries BD2 can be collinear with the electrical conductor MD2 or the poly-cut feature CPO2. The boundaries BD2 can align with the electrical conductor MD2 or the poly-cut feature CPO2. The boundaries BD3 can overlap the electrical conductor MD4 or the poly-cut feature CPO4. The boundaries BD3 can be collinear with the electrical conductor MD4 or the poly-cut feature CPO4. The boundaries BD3 can align with the electrical conductor MD4 or the poly-cut feature CPO4.

In some embodiments, the cell 211 includes the electrical conductors MD1 and MD2 and the active regions OD1 and OD2 extending along the X-axis. The cell 212 includes the electrical conductors MD2 and MD3 and the active regions OD3 and OD4 extending along the X-axis. The cell 213 includes the electrical conductors MD3 and MD4 and the active regions OD5 and OD6 extending along the X-axis. The cell 214 includes the electrical conductors MD4 and MD5 and the active regions OD7 and OD8 extending along the X-axis.

The cell 212 can have a height H21, and the cell 213 can have a height H22. The height H21 can be substantially identical to the height H22. The height H21 can be different from the height H22. The metal pitch P21 of the power ground (PG), such as the electrical conductors MD1 to MD5, can be defined as the distance between any two adjacent electrical conductors MD1 to MD5. The metal pitch P21 can be substantially identical to the height H21 and H22.

The doped region IN1 can be included in the cells 211 and 212. The doped region IN1 can overlap the electrical conductor MD2. The area of the doped region IN1 can exceed that of the electrical conductor MD2. The doped region IN1 can be shorter than the electrical conductor MD2. The width of the doped region IN1 can exceed that of the electrical conductor MD2. In some embodiments, the doped region IN2 can be included in the cells 213 and 214. The doped region IN2 can overlap the electrical conductor MD4. The area of the doped region IN2 can exceed that of the electrical conductor MD4. The doped region IN2 can be shorter than the electrical conductor MD4. The width of the doped region IN2 can exceed that of the electrical conductor MD4.

In some embodiments, the semiconductor device 200A can include a drain electrode and a source electrode. The electrical conductor MD2 can be electrically coupled to the voltage VDD1. The drain electrode of the semiconductor device 200A can be configured to receive the voltage VDD1. The electrical conductor MD4 can be electrically coupled to the voltage VDD2. The drain electrode of the semiconductor device 200A can be configured to receive the voltage VDD2. The voltage VDD1 can be different from the voltage VDD2. The voltage VDD2 can be lower than the voltage VDD1. The electrical conductors MD1, MD3 and MD5 can be electrically coupled to the voltage VSS. The source electrode of the semiconductor device 200A can be configured to receive the voltage VSS. The voltage VSS can be different from the voltages VDD1 and VDD2. The voltage VSS can be lower than the voltages VDD1 and VDD2. The voltage VSS can exceed the voltages VDD1 and VDD2.

The cells 211 and 212 can belong to a row 201 of the semiconductor device 200A, and the cells 213 and 214 can belong to another row 202 of the semiconductor device 200A. The row 201 including the electrical conductor MD2 can be applied or driven by the voltage VDD1. The row 202 including the electrical conductor MD4 can be applied or driven by the voltage VDD2. The rows 201 and 202 can be driven by different voltages VDD1 and VDD2. Hybrid power domain including the voltages VDD1 and VDD2 can be provided by the semiconductor device 200A.

Figure 2B:
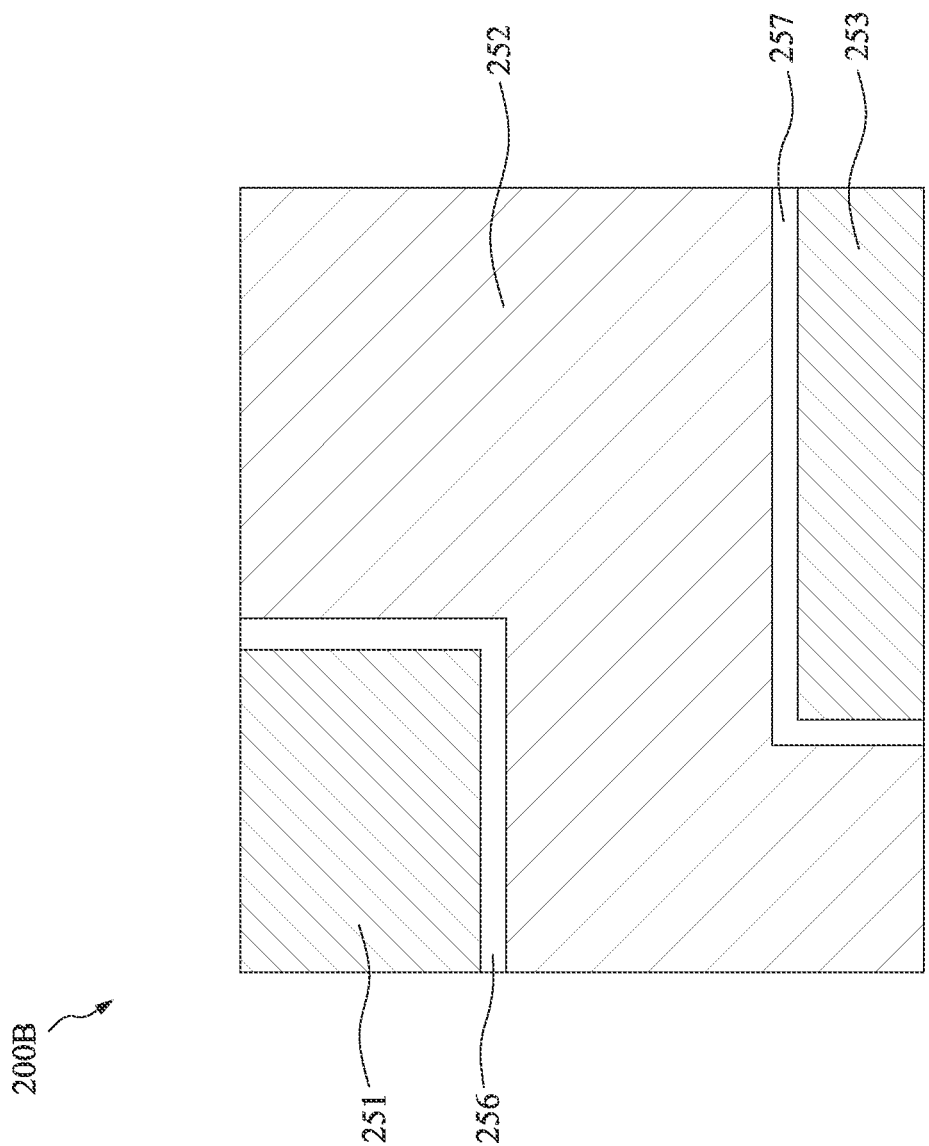
FIG. 2B is a schematic view of a chip block of a semiconductor device, in accordance with some embodiments of the present disclosure.

FIG. 2B is a schematic view of a chip block of a semiconductor device 200B, in accordance with some embodiments of the present disclosure. The semiconductor device 200B can be similar to or correspond to the semiconductor device 200A.

The semiconductor device 200B can include different power domains, such as the power domains 251, 252 and 253. The semiconductor device 200B can include a power delivery network (PDN) on backside. Each of the power domains 251, 252 and 253 can be electrically coupled to different voltages. The high voltage can be used to increase the operating and computing speed of the semiconductor device 200B. The low voltage can be used to drive simple electronic components and improve power consumption of the semiconductor device 200B. Each of the power domains 251, 252 and 253 can be electrically isolated from each other. The power domain 251 can be spaced apart from the power domain 252 be the gap 253 to prevent interference. The power domain 252 can be spaced apart from the power domain 253 be the gap 257 to prevent interference.

In some embodiments, at least one of the power domains 251, 252 and 253 can be a hybrid power domain which includes, for example, the voltages VDD1 and VDD2. Compared to the semiconductor device in which each power domain corresponds to single voltage, the semiconductor device 200B with hybrid power domain can reduce power consumption without sacrificing the frontside routing of the chip block.

Figure 3A:
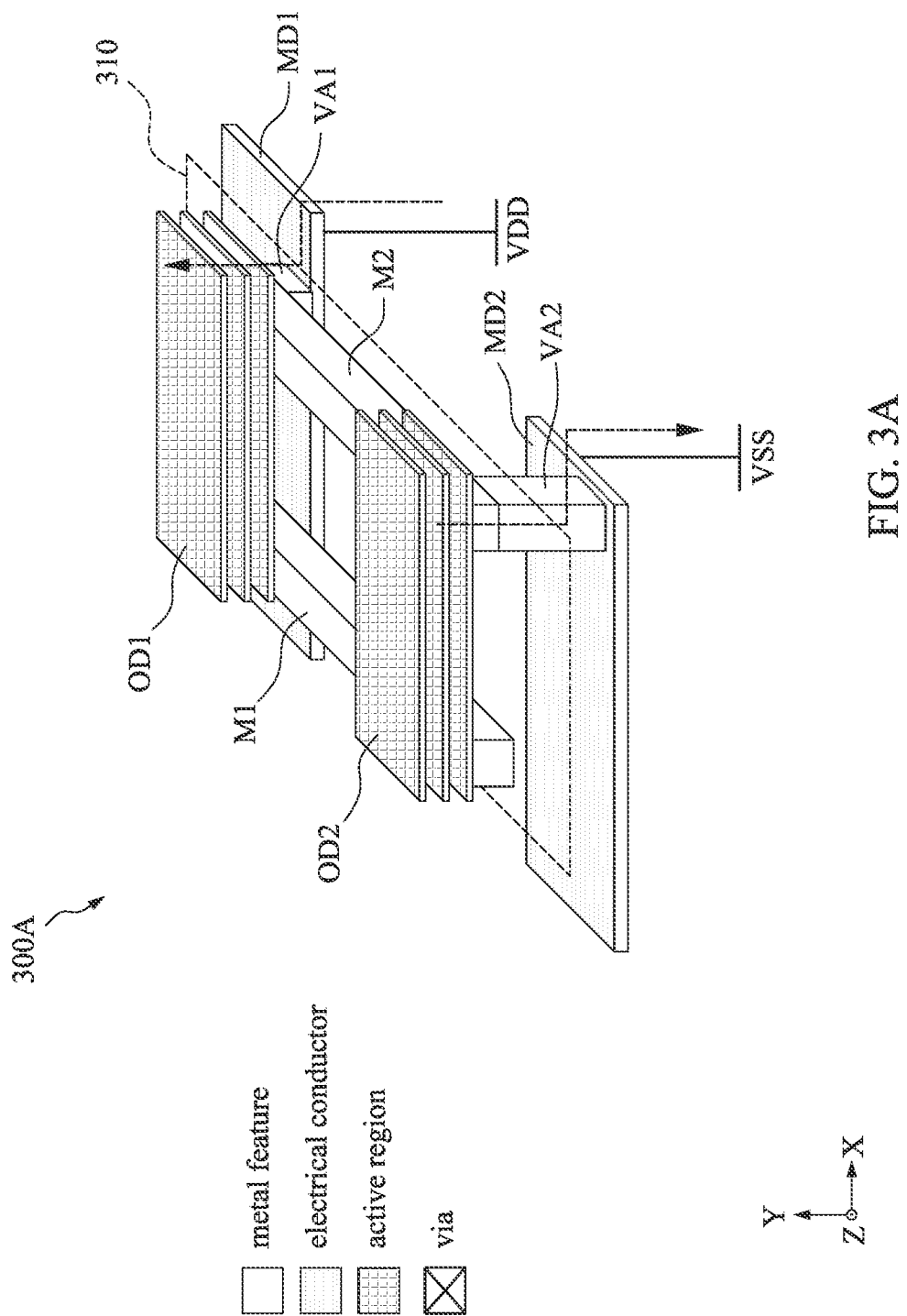
FIG. 3A is a perspective view of a semiconductor device, in accordance with some embodiments of the present disclosure.

FIG. 3A is a perspective view of a semiconductor device 300A, in accordance with some embodiments of the present disclosure. The semiconductor device 300A can be included in or similar to the semiconductor device 200A. The semiconductor device 300A can include a cell 310. The electrical conductors MD1 and MD2, metal features M1 and M2, active regions OD1 and OD2, and vias VA1 and VA2 can belong to or be formed within the cell 310. The electrical conductors MD1 and MD2 extend along the X-axis. The metal features M1 and M2 extend along the Y-axis and are disposed above the electrical conductors MD1 and MD2. The metal features M1 and M2 can be electrically coupled to the electrical conductors MD1 and MD2 through the vias VA1 and VA2 extending along the Z-axis. The active regions OD1 and OD2 extend along the X-axis and are disposed above the metal features M1 and M2. The active regions OD1 and OD2 can be electrically coupled to the metal features M1 and M2 through the vias VA1 and VA2 extending along the Z-axis. In some embodiments, the electrical conductors MD1 and MD2 are formed or disposed below the active regions OD1 and OD2. The electrical conductors MD1 and MD2 can be formed or disposed on the backside of the semiconductor device 300A. The voltages VDD and VSS can be provided or applied through the electrical conductors MD1 and MD2 of the backside of the semiconductor device 300A.

The semiconductor device 300A can be included by or applicable to a wafer. The wafer can include two sides, for example, a frontside and a backside. The frontside and the backside can be separated or divided by an interface/plane, which can be defined by, for example, the active regions OD1 and OD2. The area/region above the active regions OD1 and OD2 along the Z-axis can be regarded as the frontside, and the area/region below the active regions OD1 and OD2 along the Z-axis can be regarded as the backside. In some embodiments, the routing of the electrical conductors MD1 and MD2 are located on the backside to reserve the resource or space for the frontside routing.

Figure 3B:
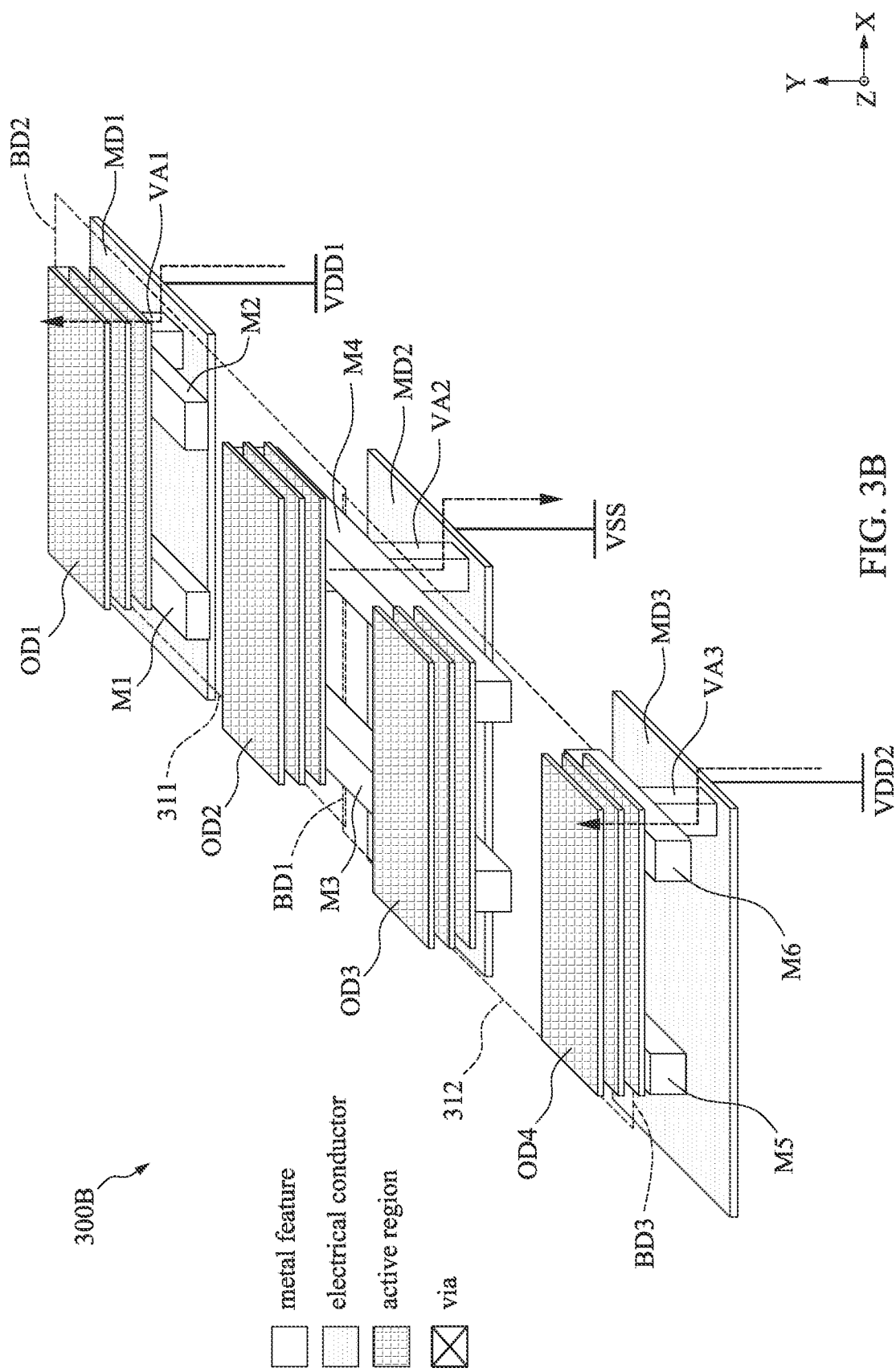
FIG. 3B is a perspective view of a semiconductor device, in accordance with some embodiments of the present disclosure.

FIG. 3B is a perspective view of a semiconductor device 300B, in accordance with some embodiments of the present disclosure. The semiconductor device 300B can be included in or similar to the semiconductor device 200A. The semiconductor device 300B can include two cells 311 and 312. The electrical conductors MD1 and MD2, metal features M1, M2, M3 and M4, active regions OD1 and OD2, and vias VA1 and VA2 can belong to or be formed within the cell 311. The electrical conductors MD2 and MD3, metal features M3, M4, M5 and M6, active regions OD3 and OD4, and vias VA2 and VA3 can belong to or be formed within the cell 312.

The electrical conductors MD1 to MD3 extend along the X-axis. The metal features M1 to M6 extend along the Y-axis and are disposed above the electrical conductors MD1 to MD3. The metal features M1 to M6 can be electrically coupled to the electrical conductors MD1 to MD3 through the vias VA1 to VA3 extending along the Z-axis. The active regions OD1 to OD4 extend along the X-axis and are disposed above the metal features M1 to M6. The active regions OD1 to OD4 can be electrically coupled to the metal features M1 to M6 through the vias VA1 to VA3 extending along the Z-axis. In some embodiments, the electrical conductors MD1 to MD3 can be electrically connected to different voltages. The electrical conductor MD1 is supplied by the voltage VDD1, the electrical conductor MD2 is supplied by the voltage VSS, and electrical conductor MD3 is supplied by the voltage VDD2. Therefore, a hybrid power domain can be achieved or provided by the semiconductor device 300B to reduce power consumption and improve routing efficiency.

Figure 4:
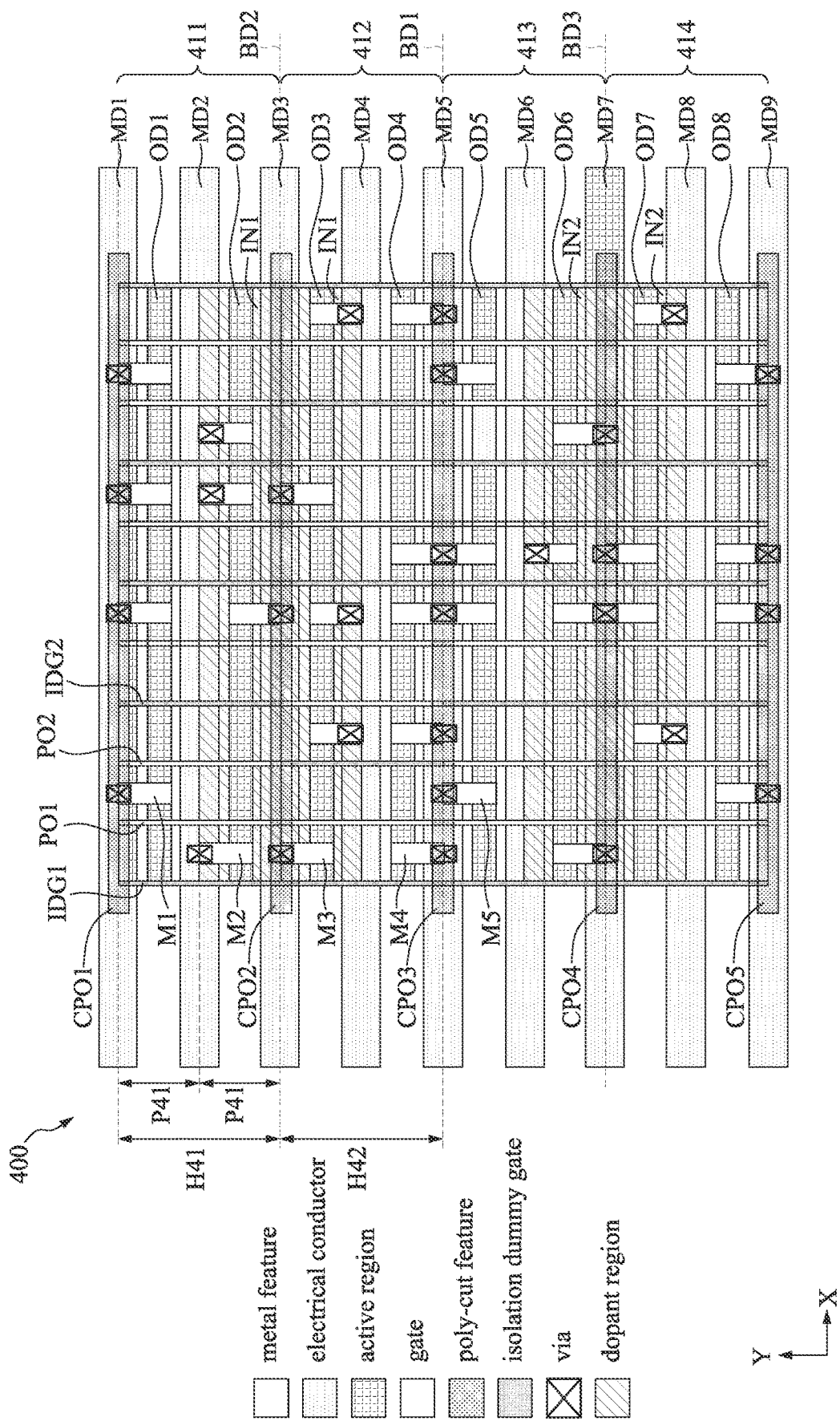
FIG. 4 is a schematic view of a layout of a semiconductor device, in accordance with some embodiments of the present disclosure.

FIG. 4 is a schematic view of a layout of a semiconductor device 400, in accordance with some embodiments of the present disclosure. The semiconductor device 400 can be similar to the semiconductor device 200A of FIG. 2A, with differences therebetween as follow.

The semiconductor device 400 can include four cells 411, 412, 413 and 414. The cells 411 to 414 can be separated by boundaries BD1, BD2 and BD3 parallel. As shown in FIG. 4, the boundary BD2 can be provided between the cells 411 and 412. The boundary BD1 can be provided between the cells 412 and 413. The boundary BD3 can be provided between the cells 413 and 414. The boundaries BD1 can overlap the electrical conductor MD5 or the poly-cut feature CPO3. The boundaries BD1 can be collinear with the electrical conductor MD5 or the poly-cut feature CPO3. The boundaries BD1 can align with the electrical conductor MD5 or the poly-cut feature CPO3. The boundaries BD2 can overlap the electrical conductor MD3 or the poly-cut feature CPO2. The boundaries BD2 can be collinear with the electrical conductor MD3 or the poly-cut feature CPO2. The boundaries BD2 can align with the electrical conductor MD3 or the poly-cut feature CPO2. The boundaries BD3 can overlap the electrical conductor MD7 or the poly-cut feature CPO4. The boundaries BD3 can be collinear with the electrical conductor MD7 or the poly-cut feature CPO4. The boundaries BD3 can align with the electrical conductor MD7 or the poly-cut feature CPO4.

In some embodiments, the cell 411 includes the electrical conductors MD1, MD2, MD3, and the active regions OD1, OD2 extending along the X-axis. The cell 412 includes the electrical conductors MD3, MD4, MD5, and the active regions OD3 and OD4 extending along the X-axis. The cell 413 includes the electrical conductors MD5, MD6, MD7, and the active regions OD5, OD6 extending along the X-axis. The cell 414 includes the electrical conductors MD7, MD8, MD9, and the active regions OD7, OD8 extending along the X-axis.

The cell 411 can have a height H41, and the cell 412 can have a height H42. The height H41 can be substantially identical to the height H42. The height H41 can be different from the height H42. The metal pitch P41 of the PG, such as the electrical conductors MD1 to MD8, can be defined as the distance between any two adjacent electrical conductors MD1 to MD8. The metal pitch P41 can be different from the height H41 and H42. The metal pitch P41 can be substantially half of the heights H41 and H42.

The doped region IN1 can be included in the cells 411 and 412. The doped region IN1 can overlap the electrical conductors MD2, MD3 and MD4. The area of the doped region IN1 can exceed that of each of the electrical conductors MD2, MD3 and MD4. The doped region IN1 can be shorter than each of the electrical conductors MD2, MD3 and MD4. The width of the doped region IN1 can exceed that of each of the electrical conductors MD2, MD3 and MD4. In some embodiments, the doped region IN2 can be included in the cells 413 and 414. The doped region IN2 can overlap the electrical conductors MD6, MD7 and MD8. The area of the doped region IN2 can exceed that of each of the electrical conductors MD6, MD7 and MD8. The doped region IN2 can be shorter than each of the electrical conductors MD6, MD7 and MD8. The width of the doped region IN2 can exceed that of each of the electrical conductors MD6, MD7 and MD8.

In some embodiments, the semiconductor device 400 can include a drain electrode and a source electrode. The electrical conductors MD3 and MD7 can be electrically coupled to the voltage VDD1. The drain electrode of the semiconductor device 400 can be configured to receive the voltage VDD1. The electrical conductors MD2, MD4, MD6 and MD8 can be electrically coupled to the voltage VDD2. The drain electrode of the semiconductor device 400 can be configured to receive the voltage VDD2. The voltage VDD1 can be different from the voltage VDD2. The voltage VDD2 can be lower than the voltage VDD1. The electrical conductors MD1, MD5 and MD9 can be electrically coupled to the voltage VSS. The source electrode of the semiconductor device 400 can be configured to receive the voltage VSS. The voltage VSS can be different from the voltages VDD1 and VDD2. The voltage VSS can be lower than the voltages VDD1 and VDD2. The voltage VSS can exceed the voltages VDD1 and VDD2.

Each of the cells 411 to 414 can belong to respective rows of the semiconductor device 400 individually. The cell 411 including the electrical conductors MD1 to MD3 can receive or be driven by the voltages VDD1 and VDD2. The cell 412 including the electrical conductors MD3 to MD5 can receive or be driven by the voltages VDD1 and VDD2. The cell 413 including the electrical conductors MD5 to MD7 can receive or be driven by the voltages VDD1 and VDD2. The cell 414 including the electrical conductors MD7 to MD9 can receive or be driven by the voltages VDD1 and VDD2. Both of the voltages VDD1 and VDD2 can be included or supplied by each of the cells 411 to 414. Hybrid power domain including the voltages VDD1 and VDD2 can be provided by each of the cells 411 to 414 of the semiconductor device 400. Compared to the semiconductor device in which each power domain corresponds to a single voltage, the semiconductor device 400 with hybrid power domain can decrease power consumption and enhance routing efficiency.

Figure 5:
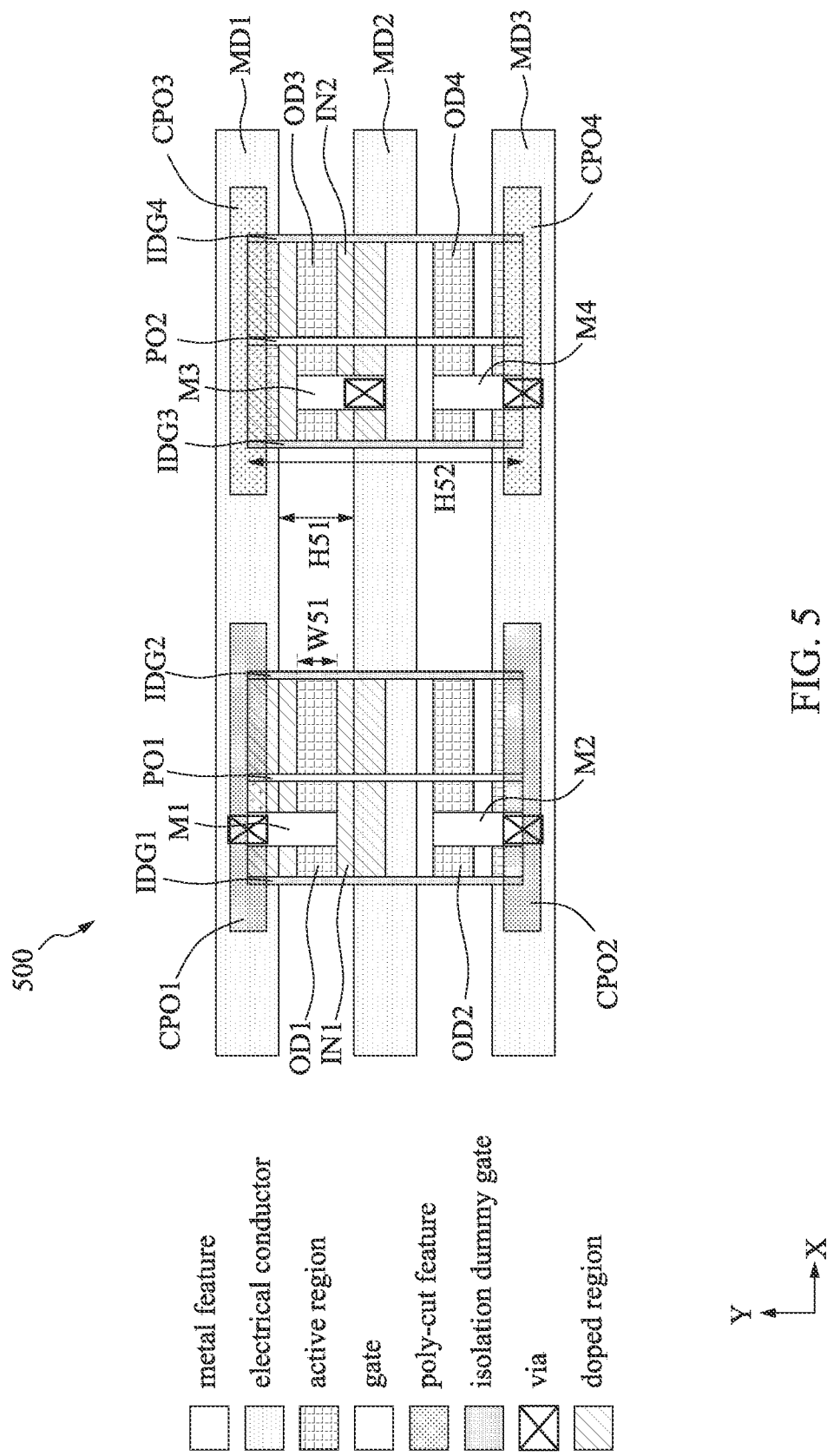
FIG. 5 is a schematic view of a layout of a semiconductor device, in accordance with some embodiments of the present disclosure.

FIG. 5 is a schematic view of a layout of a semiconductor device 500, in accordance with some embodiments of the present disclosure. The semiconductor device 500 can be included in or similar to the semiconductor device 400 of FIG. 4. The electrical conductor MD1 is spaced apart from the electrical conductor MD2 by a distance H51. The electrical conductor MD1 is spaced apart from the electrical conductor MD3 by a distance H52. Each of the active regions OD1, OD2, OD3 and OD4 has a width W51.

In some embodiments, the width W51 can be different from the distance H51. The width W51 can be substantially identical to the distance H51. The width W51 can be less than the distance H51 so that the active regions OD1 and OD2 are separated from the electrical conductor MD1. In some embodiments, the distance H51 can be different from the distance H52. The distance H51 can be less than the distance H52. The distance H52 can be twice the distance H51 and twice the width W51.

The electrical conductor MD1 can be electrically coupled to the voltage VDD1. The electrical conductor MD2 can be electrically coupled to the voltage VDD2. The electrical conductor MD3 can be electrically coupled to the voltage VSS. The active region OD1 can be electrically connected to the electrical conductor MD1 through the metal feature M1, and thus the active region OD1 can correspond to the power domain of the voltage VDD1. The active region OD2 can be electrically connected to the electrical conductor MD3 through the metal feature M2, and thus the active region OD2 can correspond to the power domain of the voltage VSS. The active region OD3 can be electrically connected to the electrical conductor MD2 through the metal feature M3 and thus the active region OD3 can correspond to the power domain of the voltage VDD2. The active region OD4 can be electrically connected to the electrical conductor MD3 through the metal feature M4, and thus the active region OD4 can correspond to the power domain of the voltage VSS.

Figure 6A:
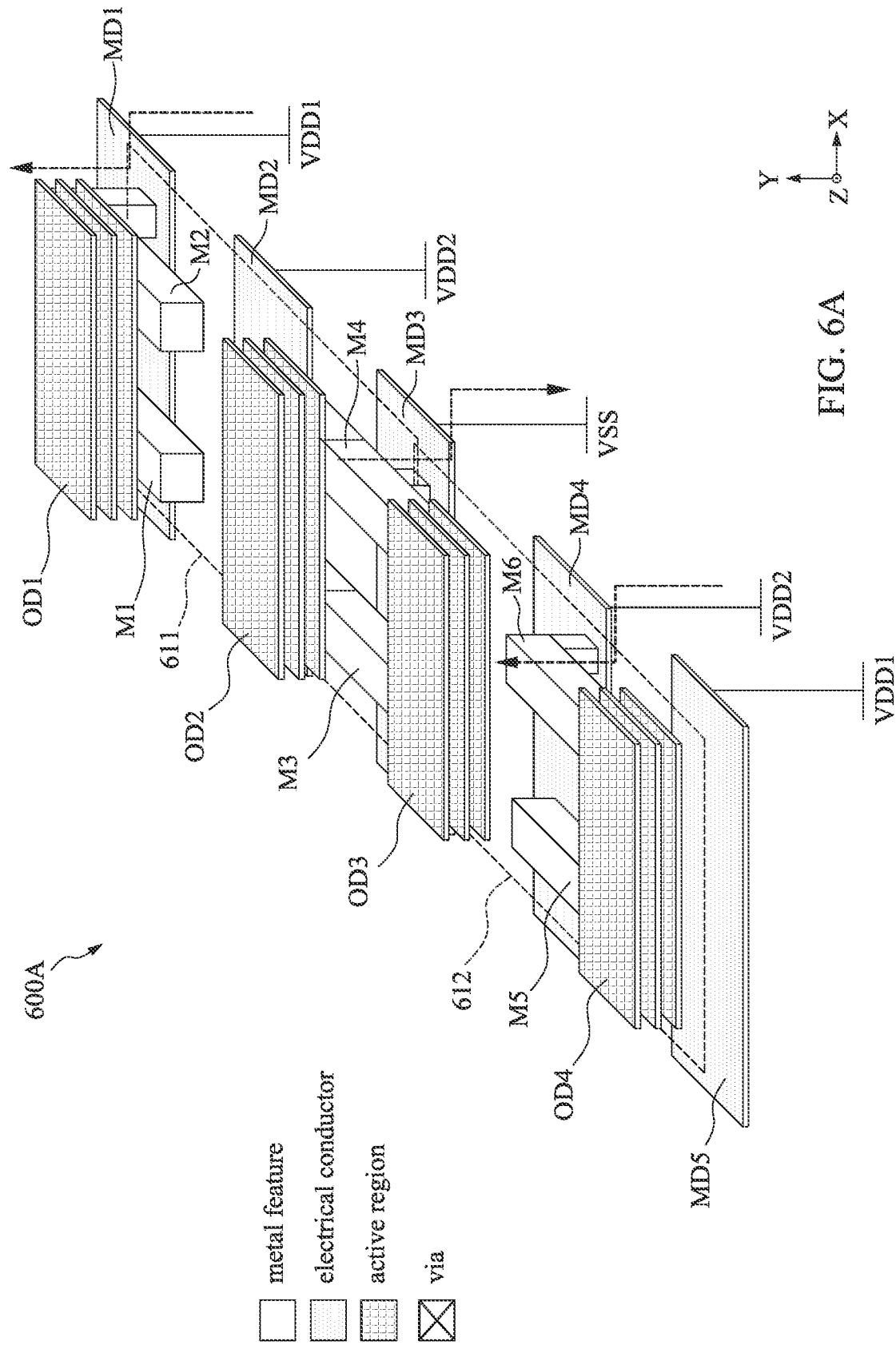
FIG. 6A is a perspective view of a semiconductor device, in accordance with some embodiments of the present disclosure.

FIG. 6A is a perspective view of a semiconductor device 600A, in accordance with some embodiments of the present disclosure. The semiconductor device 600A can be included in or similar to the semiconductor device 400. The semiconductor device 600A can include two cells 611 and 612. The electrical conductors MD1 to MD3, metal features M1 to M4, active regions OD1 and OD2 can belong to or be formed within the cell 611. The electrical conductors MD3 to MD5, metal features M3 to M6, active regions OD3 and OD4 can belong to or be formed within the cell 612. The electrical conductors MD1 to MD5 are coplanar. The metal features M1 to M6 are coplanar. The active regions OD1 to OD5 are coplanar.

The electrical conductors MD1 to MD5 extend along the X-axis. Each of the electrical conductors MD1 to MD5 can be electrically connected to the voltages VDD1, VDD2, VSS, VDD2 and VDD1 respectively. The metal features M1 to M6 extend along the Y-axis and are disposed above the electrical conductors MD1 to MD5. The metal features M1 to M6 can be electrically coupled to the electrical conductors MD1 to Md5 through the vias extending along the Z-axis. The active regions OD1 to OD4 extend along the X-axis and are disposed above the metal features M1 to M6. The active regions OD1 to OD4 can be electrically coupled to the metal features M1 to M6 through the vias extending along the Z-axis. The voltages VDD1, VDD2 and VSS can be provided or applied through the electrical conductors MD1 to MD5 of the backside of the semiconductor device 600A.

Figure 6B:
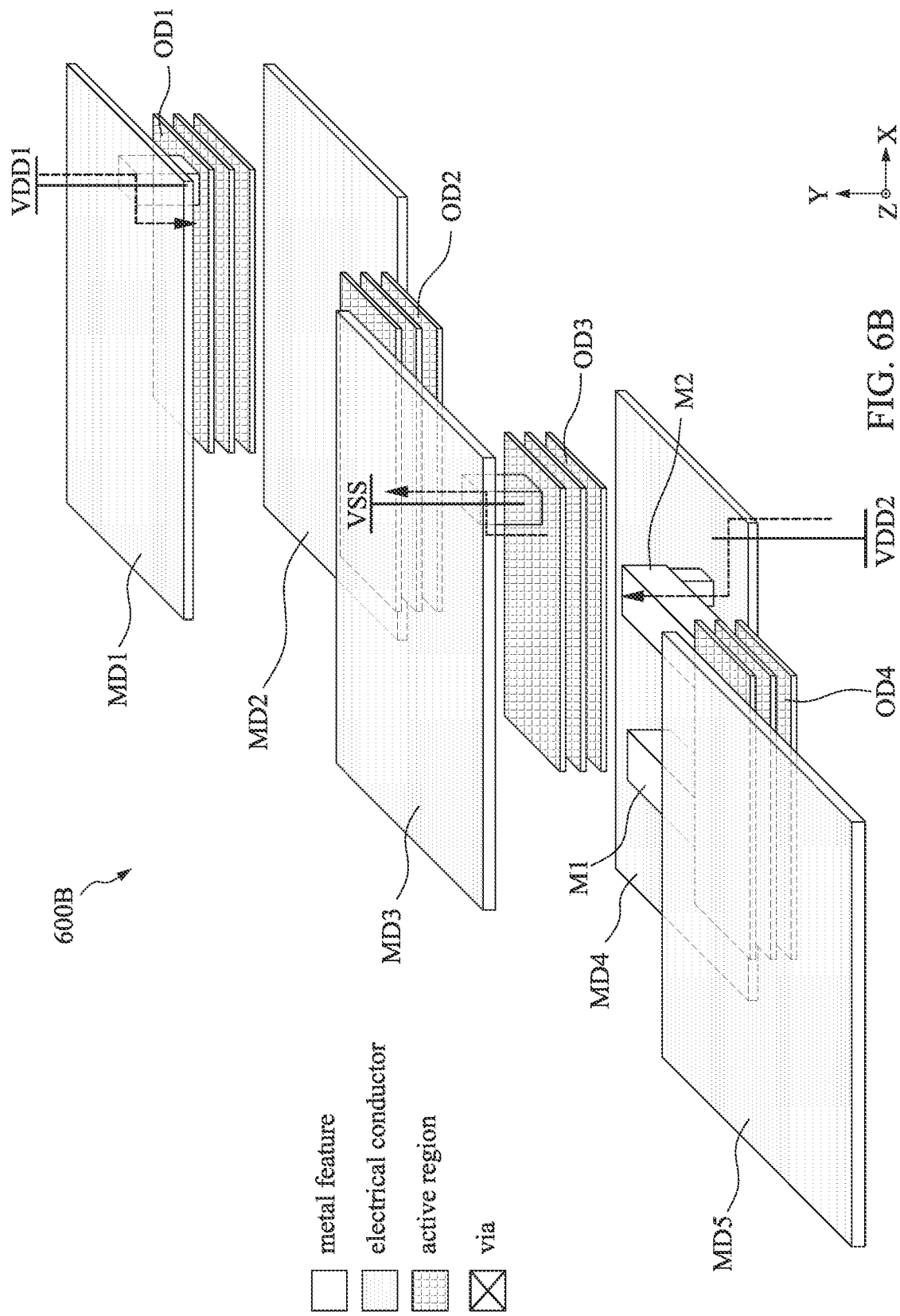
FIG. 6B is a perspective view of a semiconductor device, in accordance with some embodiments of the present disclosure.

FIG. 6B is a perspective view of a semiconductor device 600B, in accordance with some embodiments of the present disclosure. The semiconductor device 600B can be similar to the semiconductor device 600A of FIG. 6A, with differences therebetween as follow.

The electrical conductors MD1, MD3 and MD5 are coplanar. The electrical conductors MD2 and MD4 are coplanar. The metal features M1 and M2 are coplanar. The active regions OD1 to OD4 are coplanar. The electrical conductors MD1. MD3 and MD5 can be formed above the active regions OD1 to OD4. The electrical conductors MD1, MD3 and MD5 can be formed above the metal features M1 and M2. The electrical conductors MD2 and MD4 can be formed below the active regions OD1 to OD4. The electrical conductors MD2 and MD4 can be formed below the metal features M1 and M2. The voltages VDD1 and VSS can be provided or applied through the electrical conductors MD1, MD3 and MD5 of the frontside of the semiconductor device 600B. The voltage VDD2 can be provided or applied through the electrical conductors MD2 and MD4 of the backside of the semiconductor device 600B.

Figure 6C:
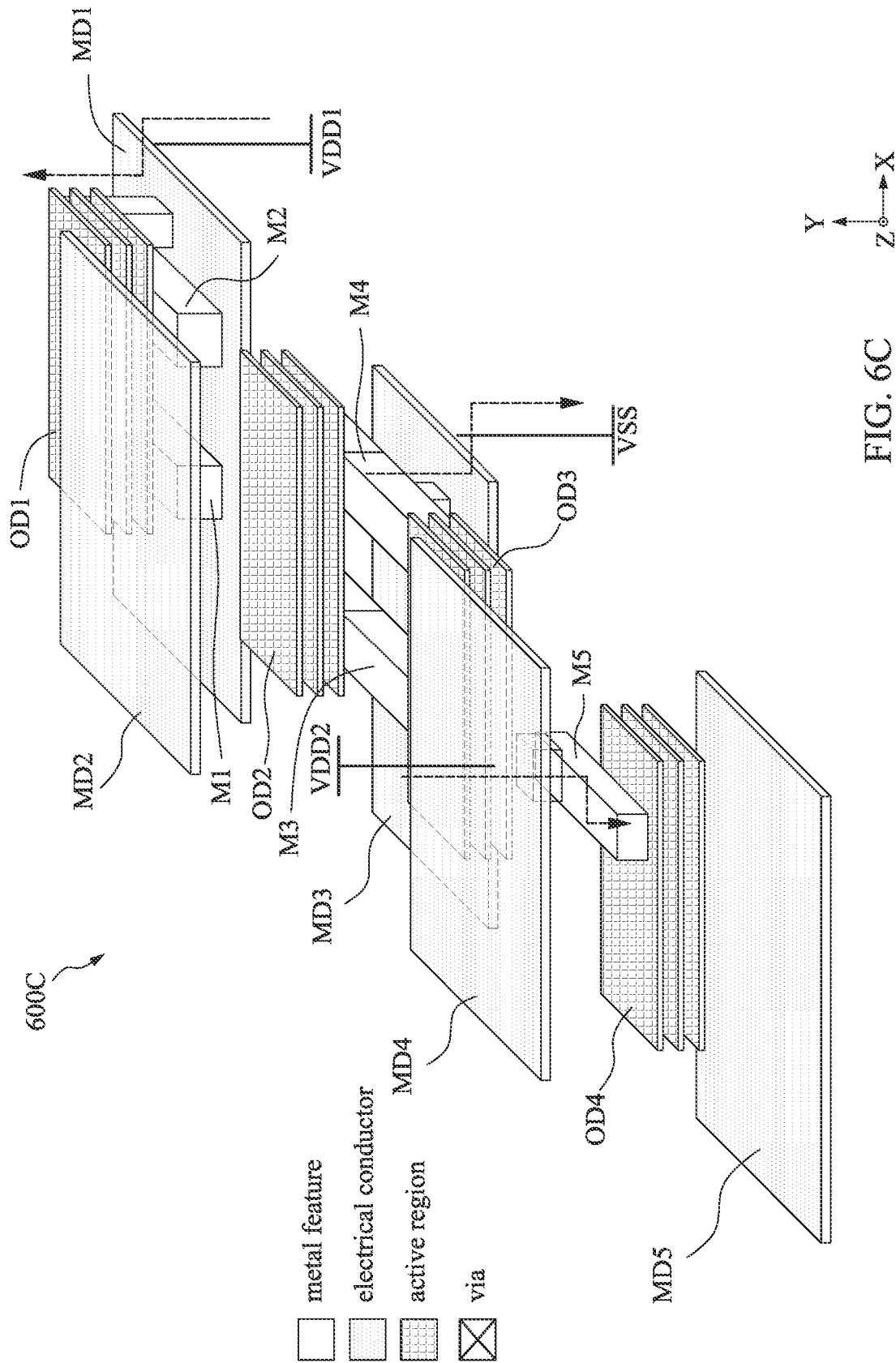
FIG. 6C is a perspective view of a semiconductor device, in accordance with some embodiments of the present disclosure.

FIG. 6C is a perspective view of a semiconductor device 600C, in accordance with some embodiments of the present disclosure. The semiconductor device 600C can be similar to the semiconductor device 600A of FIG. 6A, with differences therebetween as follow.

The electrical conductors MD1, MD3 and MD5 are coplanar. The electrical conductors MD2 and MD4 are coplanar. The metal features M1 and M2 are coplanar. The active regions OD1 to OD4 are coplanar. The electrical conductors MD1, MD3 and MD5 can be formed below the active regions OD1 to OD4. The electrical conductors MD1, MD3 and MD5 can be formed below the metal features M1 and M2. The electrical conductors MD2 and MD4 can be formed above the active regions OD1 to OD4. The electrical conductors MD2 and MD4 can be formed above the metal features M1 and M2. The voltages VDD1 and VSS can be provided or applied through the electrical conductors MD1, MD3 and MD5 of the backside of the semiconductor device 600C. The voltage VDD2 can be provided or applied through the electrical conductors MD2 and MD4 of the frontside of the semiconductor device 600C.

Figure 7:
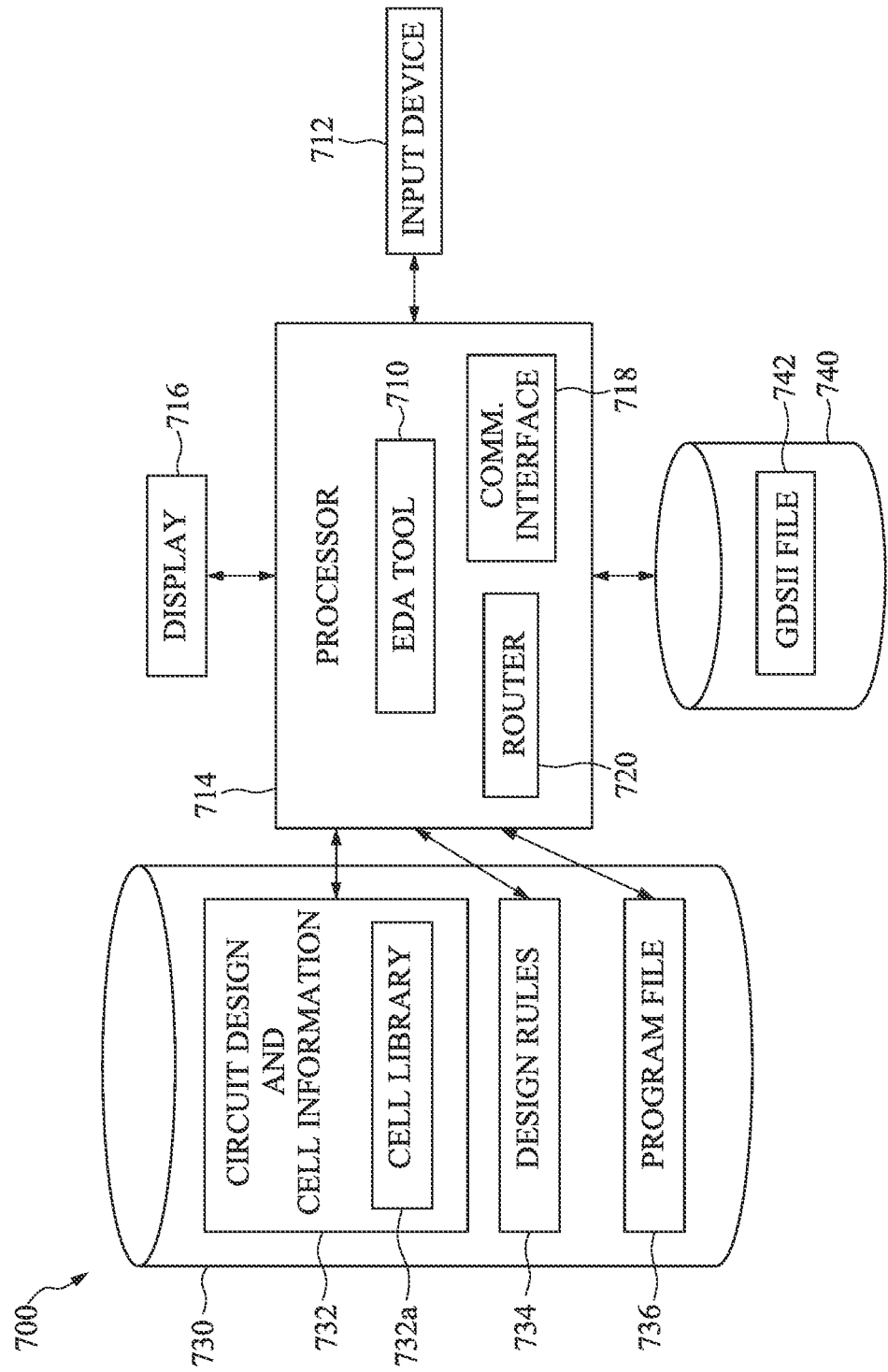
FIG. 7 is a diagram illustrating an electronic design automation system, in accordance with some embodiments of the present disclosure.

FIG. 7 is a diagram illustrating an electronic design automation system, in accordance with some embodiments of the present disclosure. As shown in FIG. 7, system 700 includes an electronic design automation ("EDA") tool 710 having a place and route tool including a chip assembly router 720.

The EDA tool 710 is a special purpose computer configured to retrieve stored program instructions 736 from a computer readable storage medium 730 and 740 and execute the instructions on a general purpose processor 714. Processor 714 may be any central processing unit ("CPU"), microprocessor, micro-controller, or computational device or circuit for executing instructions. The non-transitory computer readable storage medium 730 and 740 may be a flash memory, random access memory ("RAM"), read only memory ("ROM"), or other storage medium. Examples of RAMs include, but are not limited to, static RAM ("SRAM") and dynamic RAM ("DRAM"). ROMs include, but are not limited to, programmable ROM ("PROM"), electrically programmable ROM ("EPROM"), and electrically erasable programmable ROM ("EEPROM"), to name a few possibilities.

System 700 may include a display 716 and a user interface or input device 712 such as, for example, a mouse, a touch screen, a microphone, a trackball, a keyboard, or other device through which a user may input design and layout instructions to system 700. The one or more computer readable storage mediums 730 and 740 may store data input by a user such as a circuit design and cell information 732, which may include a cell library 732a, design rules 734, one or more program files 736, and one or more graphical data system ("GDS") II files 742.

EDA tool 710 may also include a communication interface 718 allowing software and data to be transferred between EDA tool 710 and external devices. Examples of a communications interface 718 include, but are not limited to, a modem, an Ethernet card, a wireless network card, a Personal Computer Memory Card International Association ("PCMCIA") slot and card, or the like. Software and data transferred via communications interface 718 may be in the form of signals, which may be electronic, electromagnetic, optical, or the like that are capable of being received by communications interface 718. These signals may be provided to communications interface 718 via a communications path (e.g., a channel), which may be implemented using wire, cable, fiber optics, a telephone line, a cellular link, a radio frequency ("RF") link and other communication channels. The communications interface 718 may be a wired link and/or a wireless link coupled to a local area network (LAN) or a wide area network (WAN).

Router 720 is capable of receiving an identification of a plurality of cells to be included in a circuit layout, including a list 732 of pairs of cells. The plurality of cells can be connected to each other. In some embodiments, the list 732 can be selected from the cell library 732a. Design rules 734 may be used for a variety of processing technologies. In some embodiments, the design rules 734 configure the router 720 to locate connecting lines and vias on a manufacturing grid. Other embodiments may allow the router to include off-grid connecting lines and/or vias in the layout.

Figure 8A:
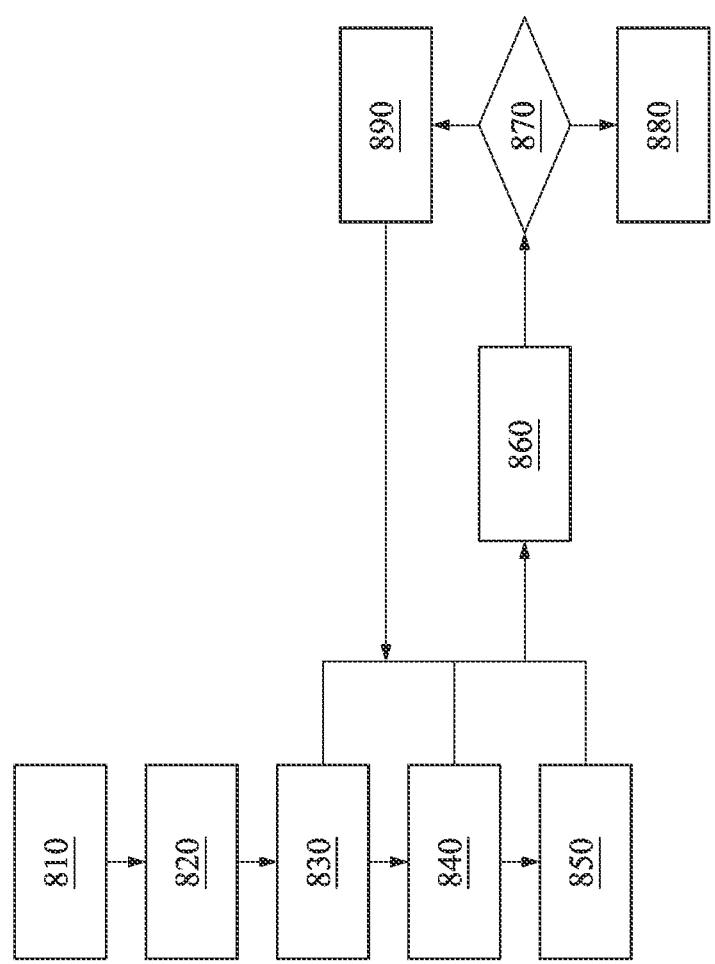
FIG. 8A is a flowchart showing a method for generating a simulated integrated circuit design layout, in accordance with some embodiments of the present disclosure.

FIG. 8A is a flowchart showing a method for generating a simulated integrated circuit design layout, in accordance with some embodiments of the present disclosure. In some embodiments, this method may correspond to an automatic placement and routing (APR) process. In some embodiments, the APR process of the present disclosure may be applied to any suitable simulated integrated circuit design layout.

The APR process shown in FIG. 8A may begin in operation 810, initializing pre-placements of a simulated integrated circuit design layout for two power domains, such as the voltages VDD1 and VDD2. The voltage VDD1 can be in representative of high operating speed. The voltage VDD0 can be representative of low power. The pre-placement simulation may be generated according to design data corresponding to an integrated circuit layout stored in a data storage device. In some embodiments, the pre-placement simulation may be executed on the design, e.g., by an EDA tool, to determine whether the design meets a predetermined specification. If the design does not meet the predetermined specification, the semiconductor device is redesigned. In some embodiments, a SPICE simulation is performed on the SPICE netlist. Other simulation tools can be employed, in place of or in addition to the SPICE simulation, in other embodiments.

In operation 820, floor planning for the integrated circuit is performed, for example, by system 700. In some embodiments, floor planning includes dividing a circuit into functional blocks, which are portions of the circuit, and identifying the layout for these functional blocks.

In operation 830, an automated placement tool may create a transistor level design by placing cells from a cell library to form the various logic and functional blocks according to the IC design. In some embodiments, the system 700 performs placement for the integrated circuit. In some embodiments, operation 830 includes determining the placement for the electronic components, circuitry, and logic elements. For example, the placement of the transistors, resistors, inductors, logic gates, and other elements of the integrated circuit can be selected in operation 830.

In some embodiments, operation 830 can include sub-operations of global placement, legalization, and detailed placement. The global placement is a rough placement of the simulated integrated circuit design layout. In some embodiments, the global placement may include distributing the cells in the simulated integrated circuit design layout with overlaps. After global placement, cells may still overlap and be misaligned with the rows. To remedy the overlap and misalignment, legalization includes removing any remaining overlaps between the cells and aligning all the cells in the simulated integrated circuit design layout. That is, legalization legalizes global placement. The detailed placement further improves wire length (or other problems) by locally rearranging the cells while maintaining legality. That is, the detailed placement provides a final placement based on the legality and wire length.

In operation 840, Clock Tree Synthesis (CTS) may be performed after the placement of cells. In some embodiments, a CTS tool synthesizes a clock tree for the entire simulated integrated circuit design layout. As it does so, the CTS tool establishes only an approximate position for each buffer forming the clock tree and only approximates the routing of signal paths that will link the buffers to one another and to synchronization, so that it can make reasonably accurate estimates of signal path delays through the clock tree.

In operation 850, an automatic routing tool then determines the connections needed between the devices in the cells, such as MOS transistors. Multiple transistors are coupled together to form functional blocks, such as adders, multiplexers, registers, and the like, in the routing step. Routing comprises the placement of signal net wires on a metal layer within placed cells to carry non-power signals between different functional blocks. In some embodiments, signal net wires are routed on the same metal level as one of the vertically adjacent metal layers in the multilevel power rails.

Once the routing is determined, automated layout tools are used to map the cells and the interconnections from the router onto a semiconductor device using the process rules and the design rules, as provided. All of these software tools are available commercially for purchase. Cell libraries that are parameterized for certain semiconductor wafer manufacturing facilities are also available.

In operation 860, timing analysis corresponding to an integrated circuit layout of a semiconductor device may be performed or executed. In some embodiments, the timing analysis can be used to test or verify the integrated circuit design layouts and/or other planar or more complex structural semiconductor manufacturing processes. More details on the timing analysis are discussed associated with the embodiments illustrated in FIG. 9.

Operation 870 ascertains whether optimum power-performance area (PPA) is achieved. If so, operation 880 can be performed to proceed to the next stage. If not, operation 870 can be performed for the non-critical path to re-execute the operations 830, 840 and 850. During the operation 870, the cell corresponding to the power domain of the voltage VDD1 can be swapped with the cell corresponding to the power domain of the voltage VDD2. In addition, a level shifter can be provided or inserted between the output of low-power circuit with the voltage VDD2 and the input of the high-power circuit with the voltage VDD1.

Figure 8B:
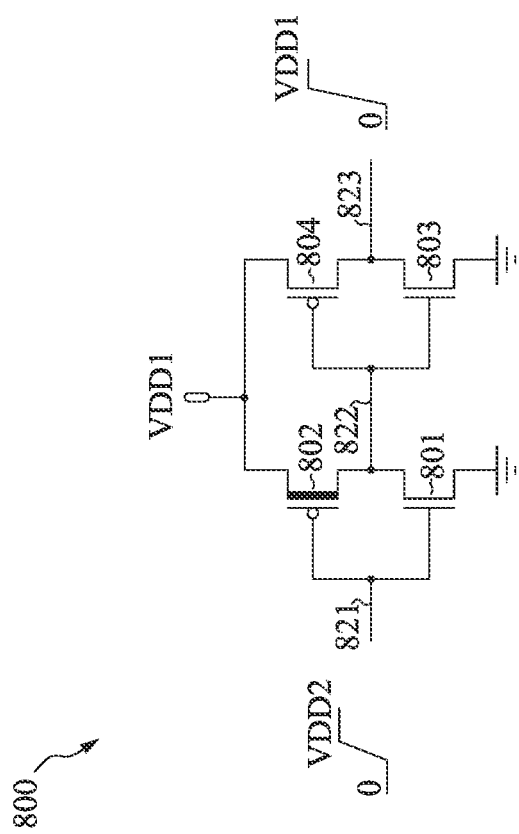
FIG. 8B is a schematic diagram illustrating a level shifter, in accordance with some embodiments of the present disclosure.

FIG. 8B is a schematic diagram illustrating a level shifter 800, in accordance with some embodiments of the present disclosure. The level shifter 800 can include a plurality of transistors, such as NMOS transistor and/or PMOS transistor. The level shifter 800 can include, for example, a planar FET, a FinFET, a nanosheet FET, or other suitable FETs. The level shifter 800 can be formed between a low-power circuit driven the voltage VDD2 and a high-power circuit driven by the voltage VDD1. The level shifter 800 can be used to ensure the proper drive strength and accurate timing as signals/voltages transition from one power level to another power level.

In some embodiments, the level shifter 800 can include transistors 801, 802, 803 and 804. Each of the transistors 801 and 803 can include a NMOS transistor, and each of the transistors 802 and 804 can include a PMOS transistor. Each of the transistors 801, 803 and 804 can include an enhancement-mode FET. The transistor 802 can include a depletion-mode FET. The transistors 801, 802, 803 and 804 can be applied or driven by the voltage VDD1. The node 821 can serve as an input of the level shifter 800 for receiving the voltage VDD2. The node 821 is electrically connected to the gates of the transistors 801 and 802. The node 822 is electrically connected to the source/drain of the transistors 801 and 802 and the gates of the transistors 803 and 804. The node 823 is electrically connected to the source/drain of the transistors 803 and 804. The node 823 can serve as an output of the level shifter 800 for transmitting the voltage VDD1.

Figure 9:
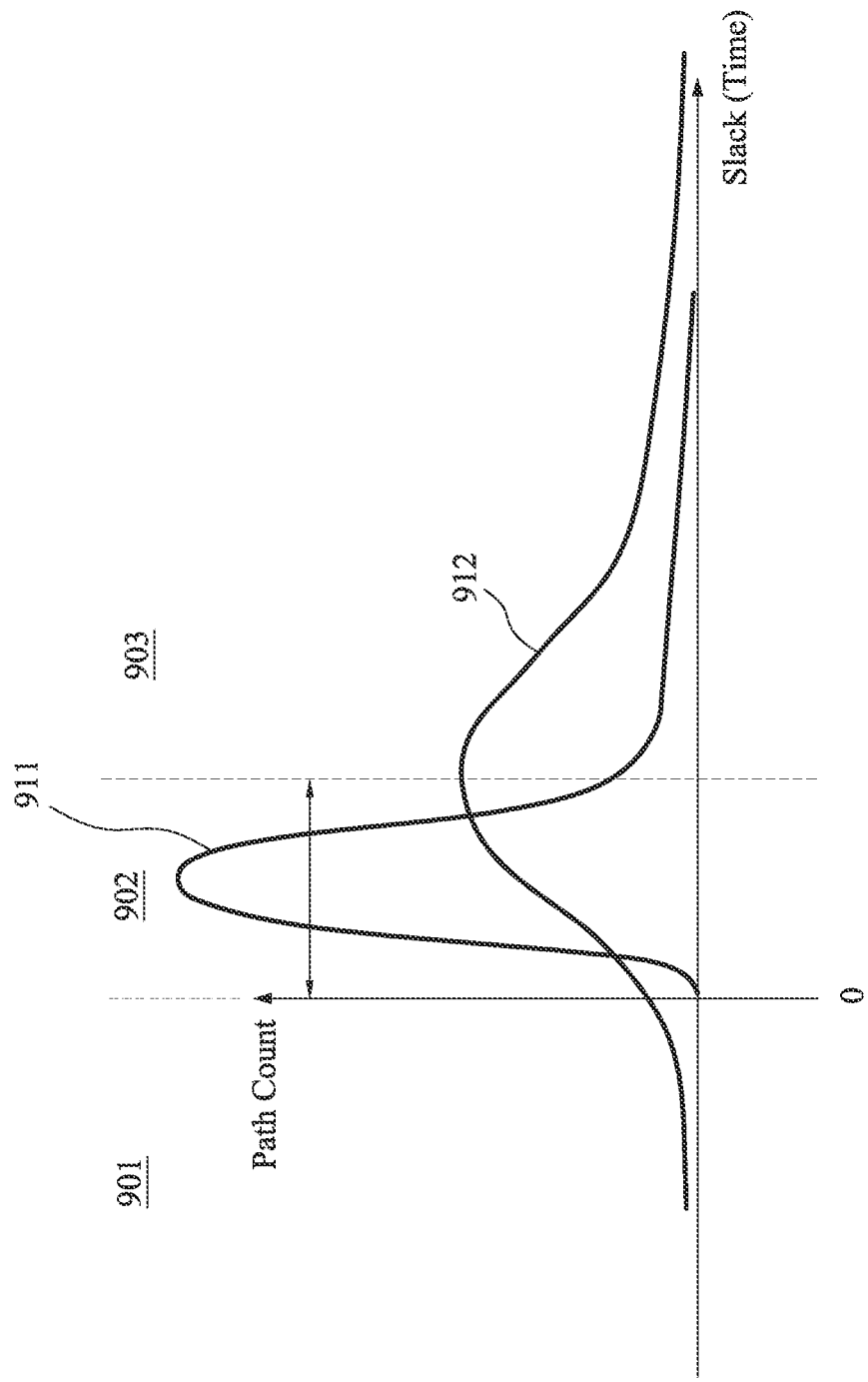
FIG. 9 is a diagram of a timing analysis for generating a simulated integrated circuit design layout, in accordance with some embodiments of the present disclosure.

FIG. 9 is a diagram of a timing analysis for generating a simulated integrated circuit design layout, in accordance with some embodiments of the present disclosure. The timing analysis for the semiconductor device can be executed in terms of path count and slack. Slack can be in representative to the margin by which a timing requirement is met or not. Positive slack indicates the margin by which a requirement is met, and negative slack indicates the margin by which a requirement is not met.

As shown in FIG. 9, the slack distribution can be separated into three zones 901, 902 and 903. The zones 901 and 902 can be divided by the slack of zero. The zones 902 and 903 can be divided by the slack of a predetermined threshold. In zone 901, the swap process between the power domains of the voltages VDD1 and VDD2 is forbidden. In zone 902, the power domain of the voltage VDD1 can be swapped into the power domain of the voltage VDD2 when the slack is larger than zero. In zone 903, the power domain of the voltage VDD1 can be all swapped into the power domain of the voltage VDD2. By utilizing the swap process, the curve 912 can be gradually optimized into the curve 911 in order to achieve the PPA as indicated in operation 870 of FIG. 8A.

Figure 10:
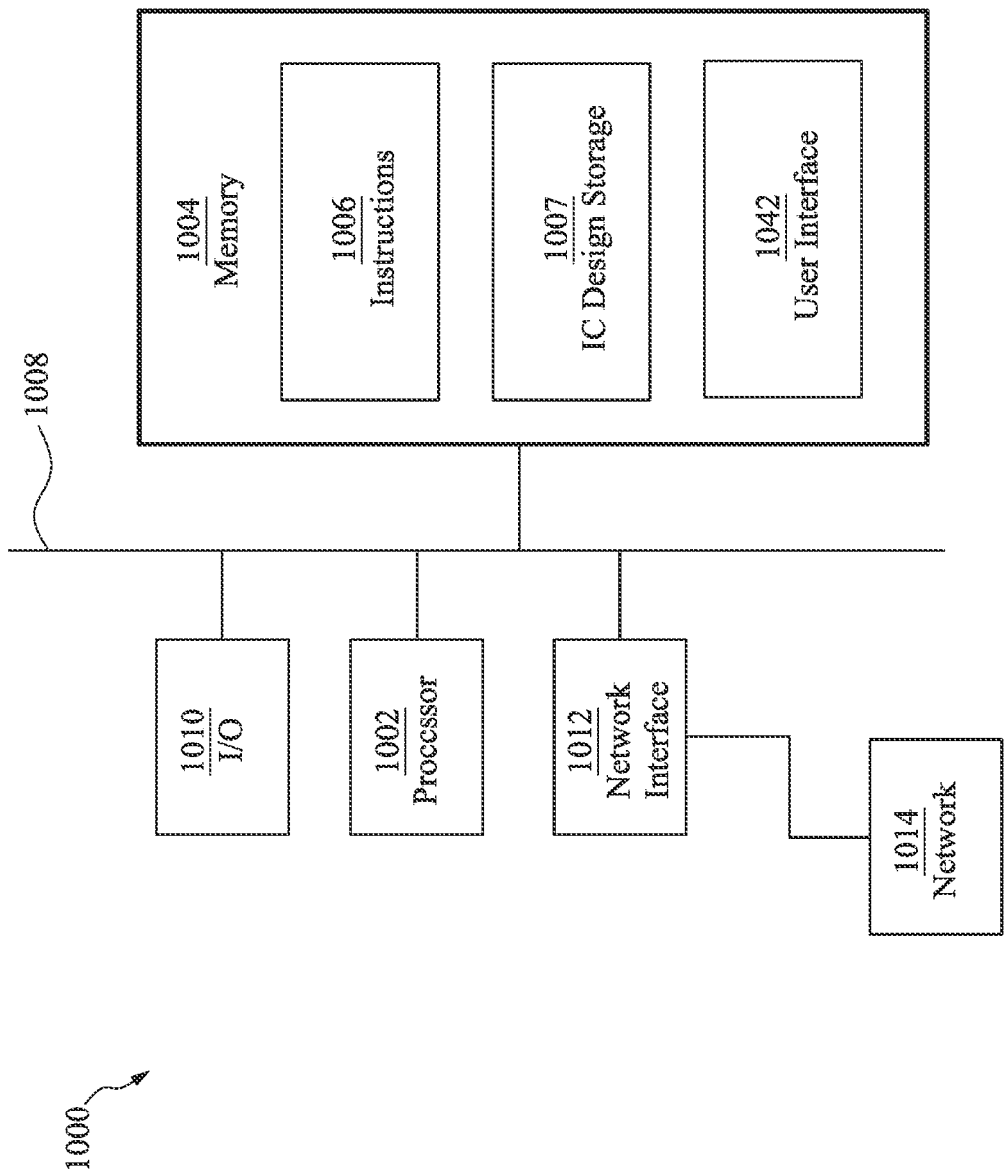
FIG. 10 is a block diagram of an IC layout diagram generation system, in accordance with some embodiments.

FIG. 10 is a block diagram of IC design system 1000, in accordance with some embodiments. Methods described herein of designing IC layout diagrams in accordance with one or more embodiments are implementable, for example, using IC design system 1000, in accordance with some embodiments. In some embodiments, IC design system 1000 can be an APR system, can include an APR system, or can be a part of an APR system, usable for performing an APR method.

In some embodiments, IC design system 1000 includes a processor 1002 and non-transitory, computer-readable memory 1004. Memory 1004, amongst other things, is encoded with, i.e., stores, computer program code, i.e., a set of executable instructions 1006. Execution of instructions 1006 by the processor 1002 represents (at least in part) an EDA tool which implements a portion or all of a method, e.g., a method of generating an IC layout diagram described above (hereinafter, the noted processes and/or methods).

Processor 1002 is electrically coupled to computer-readable memory 1004 via a bus 1008. Processor 1002 is also electrically coupled to an I/O interface 1010 by bus 1008. Network interface 1012 is also electrically connected to processor 1002 via bus 1008. Network interface 1012 is connected to a network 1014, so that processor 1002 and computer-readable memory 1004 are capable of connecting to external elements via network 1014. Processor 1002 is configured to execute instructions 1006 encoded in computer-readable memory 1004 in order to cause IC design system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, memory 1004 is an electronic, magnetic, optical, electromagnetic, infrared, and/or a semiconductor system (or apparatus or device). For example, memory 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, memory 1004 includes a compact disk-read only memory (CD-ROM), a compact disk-read/write (CD-R/W), and/or a digital video disc (DVD).

In one or more embodiments, memory 1004 stores instructions 1006 configured to cause IC design system 1000 (where such execution represents (at least in part) the EDA tool) to be usable for performing a portion or all of the noted processes and/or methods. In one or more embodiments, memory 1004 also stores information which facilitates performing a portion or all of the noted processes and/or methods. In one or more embodiments, memory 1004 includes IC design storage 1007 configured to store one or more IC layout diagrams.

IC design system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

IC design system 1000 also includes network interface 1012 coupled to processor 1002. Network interface 1012 allows IC design system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC design systems 1000.

IC design system 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. IC design system 1000 is configured to receive information related to a UI through I/O interface 1010. The information is stored in memory 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC design system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
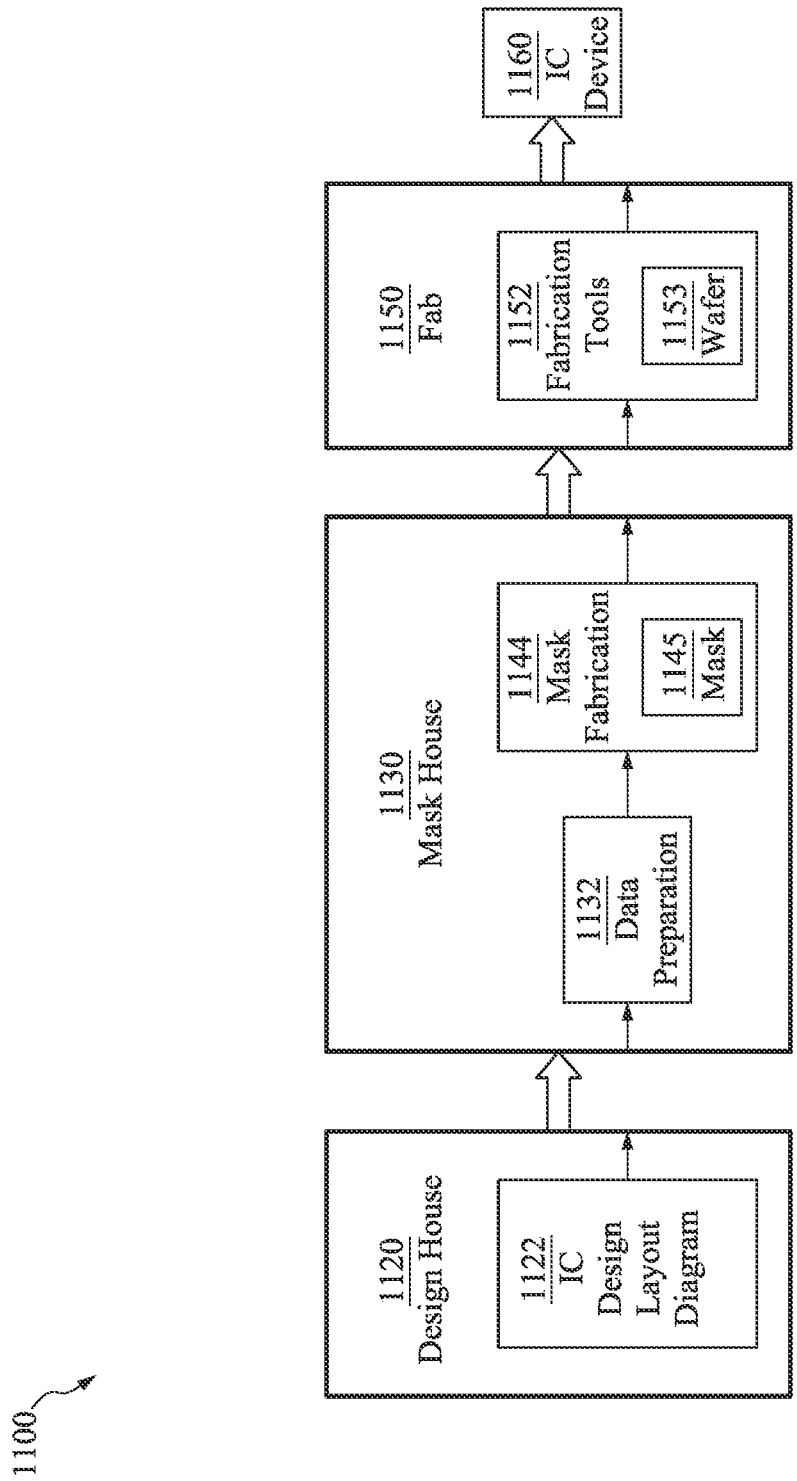
FIG. 11 is a block diagram of an IC manufacturing system, and an IC manufacturing flow associated therewith, in accordance with some embodiments.

FIG. 11 is a block diagram of IC manufacturing system 1100, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns, e.g., an IC layout diagram discussed above. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file (RDF). Mask data preparation 1132 provides the RDF to mask fabrication 1144. Mask fabrication 1144 includes a mask writer. A mask writer converts the RDF to an image on a substrate, such as mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front-end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes wafer fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

Some embodiments of the present disclosure provide a semiconductor device. The semiconductor device comprises a first electrical conductor, a second electrical conductor, a third electrical conductor, a plurality of metal features, and a plurality of active regions. The first electrical conductor extends along a first direction and is electrically coupled to a first voltage. The second electrical conductor extends along the first direction and is electrically coupled to a second voltage. The second voltage is lower than the first voltage. The third electrical conductor extending along the first direction is electrically coupled to a third voltage and disposed between the first electrical conductor and the second electrical conductor. The metal features extend along a second direction perpendicular to the first and are formed above the first electrical conductor, the second electrical conductor and the third electrical conductor. The active regions extend along the first direction and are formed above the metal features.

Some embodiments of the present disclosure provide a semiconductor device. The semiconductor device comprises a plurality of cells. The semiconductor device comprises a first electrical conductor, a second electrical conductor, a third electrical conductor, a metal feature and an active region. The first electrical conductor extends along a first direction and is electrically coupled to a first voltage. The first electrical conductor overlaps one of the boundaries between two adjacent cells. The second electrical conductor extends along the first direction and is electrically coupled to a third voltage. The second electrical conductor overlaps another of the boundaries between two adjacent cells. The third electrical conductor extending along the first direction is electrically coupled to a second voltage and disposed between the first electrical conductor and the second electrical conductor. The metal feature extends along a second direction perpendicular to the first direction. The active region extends along the first direction and is formed above the metal feature.

Some embodiments of the present disclosure provide a method for manufacturing a semiconductor device. The method includes forming a first electrical conductor extending along a first direction and electrically coupled to a first voltage, forming a second electrical conductor extending along the first direction and electrically coupled to a second voltage, wherein the second voltage is smaller than the first voltage, forming a third electrical conductor extending along the first direction, electrically coupled to a third voltage and being disposed between the first electrical conductor and the second electrical conductor, forming a plurality of metal features extending along a second direction perpendicular to the first direction and formed above the first electrical conductor, the second electrical conductor, and the third electrical conductor, and forming a plurality of active regions extending along the first direction and formed above the metal features.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first electrical conductor extending along a first direction and electrically coupled to a first voltage;
   a second electrical conductor extending along the first direction and electrically coupled to a second voltage, wherein the second voltage is smaller than the first voltage;
   a third electrical conductor extending along the first direction, electrically coupled to a third voltage and being disposed between the first electrical conductor and the second electrical conductor;
   a plurality of metal features extending along a second direction perpendicular to the first direction and formed above the first electrical conductor, the second electrical conductor and the third electrical conductor; and
   a plurality of active regions extending along the first direction and formed above the metal features.

2. The semiconductor device of claim 1, wherein a drain electrode of the semiconductor device is configured to receive the first voltage and the second voltage, and a source electrode of the semiconductor device is configured to receive the third voltage.

3. The semiconductor device of claim 1, wherein the metal features are electrically connected to the first electrical conductor, the second electrical conductor and the third electrical conductor through a plurality of vias.

4. The semiconductor device of claim 1, comprising:
   a first cell, comprising the first electrical conductor; and
   a second cell, comprising the second electrical conductor, wherein the third electrical conductor overlaps a first boundary between the first cell and the second cell.

5. The semiconductor device of claim 4, wherein the first electrical conductor overlaps a second boundary of the first cell parallel with the first boundary.

6. The semiconductor device of claim 4, wherein the second electrical conductor overlaps a third boundary of the second cell parallel with the first boundary.

7. The semiconductor device of claim 1, further comprising a doped region, wherein area of the doped region is larger than that of the first electrical conductor and overlapping the first electrical conductor.

8. A semiconductor device comprising a plurality of cells, the semiconductor device comprising:
   a first electrical conductor extending along a first direction and electrically coupled to a first voltage, wherein the first electrical conductor overlaps one of the boundaries between two adjacent ones of the cells;
   a second electrical conductor extending along the first direction and electrically coupled to a third voltage, wherein the second electrical conductor overlaps another one of the boundaries between two adjacent ones of the cells;
   a third electrical conductor extending along the first direction, electrically coupled to a second voltage and being disposed between the first electrical conductor and the second electrical conductor;
   a metal feature extending along a second direction perpendicular to the first direction; and
   an active region extending along the first direction and formed above the metal feature.

9. The semiconductor device of claim 8, wherein the third electrical conductor is spaced apart from the boundaries between two adjacent ones of the cells.

10. The semiconductor device of claim 8, wherein the first electrical conductor is coplanar with the second electrical conductor.

11. The semiconductor device of claim 10, wherein the first electrical conductor and the second electrical conductor are formed above the active region, and the third electrical conductor is formed below the active region.

12. The semiconductor device of claim 10, wherein the first electrical conductor and the second electrical conductor are formed below the active region, and the third electrical conductor is formed above the active region.

13. The semiconductor device of claim 8, wherein the first electrical conductor is spaced apart from the third electrical conductor by a first distance, wherein the active region has a width, and wherein the width is smaller than the first distance.

14. The semiconductor device of claim 13, wherein the first electrical conductor is spaced apart from the second electrical conductor by a second distance, and wherein the first distance is less than or equal to half of the second distance.

15. The semiconductor device of claim 14, wherein the second distance is substantially equal to twice the first distance and twice the width.

16. The semiconductor device of claim 8, wherein the third voltage applied to the second electrical conductor is different from the first voltage applied to the first electrical conductor.

17. A method for manufacturing a semiconductor device, comprising:
   forming a first electrical conductor extending along a first direction and electrically coupled to a first voltage;
   forming a second electrical conductor extending along the first direction and electrically coupled to a second voltage, wherein the second voltage is smaller than the first voltage;
   forming a third electrical conductor extending along the first direction, electrically coupled to a third voltage and being disposed between the first electrical conductor and the second electrical conductor;
   forming a plurality of metal features extending along a second direction perpendicular to the first direction and formed above the first electrical conductor, the second electrical conductor and the third electrical conductor; and
   forming a plurality of active regions extending along the first direction and formed above the metal features.

18. The method of claim 17, further comprising:
   forming a first cell comprising the first electrical conductor; and forming a second cell comprising the second electrical conductor, wherein the third electrical conductor overlaps a first boundary between the first cell and the second cell.

19. The method of claim 18, wherein the first electrical conductor overlaps a second boundary of the first cell parallel with the first boundary.

20. The method of claim 17, wherein the first voltage and the second voltage are electrically connected to a drain electrode, and the third voltage comprises a source electrode.

\* \* \* \* \*